(12) United States Patent
Cargill et al.

(10) Patent No.: US 9,695,038 B2
(45) Date of Patent: Jul. 4, 2017

(54) MEMS DEVICES WITH MEMBRANE HAVING VENTING FLAPS HINGEDLY ATTACHED TO ONE ANOTHER

(71) Applicant: Cirrus Logic International Semiconductor Ltd., Edinburgh (GB)

(72) Inventors: Scott Lyall Cargill, Edinburgh (GB); Marek Sebastian Piechocinski, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 0 days.

(21) Appl. No.: 14/971,226

(22) Filed: Dec. 16, 2015

(65) Prior Publication Data

US 2016/0176704 A1 Jun. 23, 2016

(30) Foreign Application Priority Data

Dec. 19, 2014 (GB) .................................. 1422774.8

(51) Int. Cl.
*B81B 7/00* (2006.01)
*H01L 29/00* (2006.01)
(Continued)

(52) U.S. Cl.
CPC ......... *B81B 7/0061* (2013.01); *H04R 19/005* (2013.01); *H04R 19/04* (2013.01);
(Continued)

(58) Field of Classification Search
CPC .... B81B 2201/0257; B81B 2201/0264; B81B 2203/0127; B81B 7/0061; B81B 3/0027; H04R 19/04
See application file for complete search history.

(56) References Cited

U.S. PATENT DOCUMENTS

2005/0146241 A1* 7/2005 Wan ...................... H02N 1/006
                                                                    310/309
2013/0223023 A1   8/2013 Dehe et al.
(Continued)

FOREIGN PATENT DOCUMENTS

CN       201854425 U    6/2011
GB         2506174 A    3/2014
(Continued)

OTHER PUBLICATIONS

Combined Search and Examination Report, Application No. GB1422774.8 mailed Jul. 10, 2015, 8 pages.
(Continued)

*Primary Examiner* — John C Ingham
*Assistant Examiner* — Ismail Muse
(74) *Attorney, Agent, or Firm* — Jackson Walker L.L.P.

(57) ABSTRACT

This application relates to MEMS transducer having a membrane layer (101) and at least one variable vent structure (301). The variable vent structure has a vent hole for venting fluid so as to reduce a pressure differential across the membrane layer and a moveable vent cover (302a, 302b) which, at an equilibrium position, at least partly blocks the vent hole. The vent cover is moveable from its equilibrium position in response to a pressure differential across the vent cover so as to vary the size of a flow path through the vent hole. In various embodiments the vent cover comprises at least a first flap section (302a) and a second flap section (302b), the first flap section being hingedly coupled to the side of the vent hole and the second flap section being hingedly coupled to the first flap section so as to be moveable with respect to the first flap section. In some embodiments the second flap section (302b) may be configured so that it deflects away from the first section (302a) more readily than the first section deflects away from its equilibrium position.

24 Claims, 10 Drawing Sheets

(51) Int. Cl.
*H04R 19/00* (2006.01)
*H04R 19/04* (2006.01)

(52) U.S. Cl.
CPC .......... *B81B 2201/0257* (2013.01); *B81B 2201/0264* (2013.01); *B81B 2203/0127* (2013.01)

(56) References Cited

U.S. PATENT DOCUMENTS

2013/0223654 A1* 8/2013 Dehe .............. B81B 3/0078
381/174
2014/0367811 A1 12/2014 Nakagawa et al.
2015/0021723 A1* 1/2015 Cheng .............. B81B 7/0029
257/419
2015/0207435 A1* 7/2015 Rombach .......... H02N 1/08
310/300

FOREIGN PATENT DOCUMENTS

KR 20140000173 A 1/2014
WO 2014026857 A1 2/2014

OTHER PUBLICATIONS

International Search Report and Written Opinion, Application No. PCT/GB2015/054013, mailed May 17, 2016, 19 pages.

* cited by examiner

MEMS DEVICES WITH MEMBRANE HAVING VENTING FLAPS HINGEDLY ATTACHED TO ONE ANOTHER

FIELD OF DISCLOSURE

This invention relates to micro-electro-mechanical system (MEMS) devices and processes, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones, wearable devices and portable computing devices.

Microphone devices formed using MEMS fabrication processes typically comprise one or more membranes with electrodes for read-out/drive deposited on the membranes and/or substrate. In the case of MEMS pressure sensors and microphones the read out is usually accomplished by measuring the capacitance between the electrodes. In the case of output transducers, the membrane is moved by electrostatic forces generated by varying a potential difference applied across the electrodes.

SUMMARY

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 103 is mechanically coupled to the flexible membrane, and together they form a first capacitive plate of the capacitive microphone device. A second electrode 102 is mechanically coupled to a generally rigid structural layer or back-plate 104, which together form a second capacitive plate of the capacitive microphone device. In the example shown in FIG. 1a the second electrode 102 is embedded within the back-plate structure 104, although it will be appreciated by those skilled in the art that the second electrode could be on the surface of the backplate.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

A plurality of holes, hereinafter referred to as bleed holes 111, connect the first cavity 109 and the second cavity 110.

A further plurality of holes, hereinafter referred to as acoustic holes 112, are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the back-plate may be arranged in the front volume, so that incident sound reaches the membrane via the acoustic holes 112 in the back-plate 104. In such a case the substrate cavity 108 may be sized to provide at least a significant part of a suitable back-volume.

In other applications, the microphone may be arranged so that sound may be received via the substrate cavity 108 in use, i.e., the substrate cavity forms part of an acoustic channel to the membrane and part of the front volume. In such applications the back-plate 104 forms part of the back-volume which is typically enclosed by some other structure, such as a suitable package.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without significantly impacting on sensitivity at the desired acoustic frequencies.

To be suitable for use in portable electronic devices such transducers should be able to survive the expected handling and use of the portable device, which may include the device being subjected to loud noises and being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This compression may result in a high pressure impulse incident on the transducer. It has been found that in conventional MEMS transducers high pressure impulses can potentially lead to damage of the transducer.

To help prevent any damage which may be caused by these high pressure impulses it has been proposed that the MEMS transducer could be provided with at least one variable vent which can provide a flow path between the front and back volumes that has a size that can vary in use. In a high pressure situation the variable vent(s) provide a relatively large flow path between the volumes so as to provide for relatively rapid equalisation between the volumes, reducing the extent and/or duration of a high pressure event on the membrane. At lower pressures however, within the expected normal operating range of the transducer, the size of the flow path, if any, is smaller.

The variable vent structure thus acts as a type of pressure relief valve to reduce the pressure differential acting on the membrane at relatively high pressure differentials. However, unlike the bleed holes which may be present in the membrane which have a fixed area and thus a fixed size of flow path, the variable vent has a flow path size which varies in response to a pressure differential. Thus the degree to which the variable vent allows venting depends on the pressure differential acting on the vent—which clearly depends on the pressure of at least one of the first and second volumes. The variable vent therefore provides a variable acoustic impedance.

One proposed variable vent structure has a moveable portion which is moveable so as to open a hole extending between the volumes on either side of the membrane. FIGS. 2a and 2b illustrate such a known variable vent structure. FIG. 2a illustrates the flexible membrane 101 of a transducer such as described above in relation to FIGS. 1a and 1b (the rest of the transducer structure being omitted for clarity). The membrane is supported between a first volume, which includes cavity 109, and a second volume which includes cavity 110. As described above the membrane will typically have a plurality of bleed holes 111 which are dimensioned and arranged to produce a tuned effect on the transducer and reduce the impact of low frequency pressure variations. However such bleed holes are designed to have a limited impact on dynamic pressure variations at the acoustic frequencies of interest and thus provide very limited response to sudden high pressure events.

The transducer structure of FIG. 2a thus also includes variable vent structures 201 formed, as illustrated by FIG. 2b, by movable portions 202 which are movable with respect to a hole, in this case a hole through the membrane 101. The moveable portion 202 is arranged to occupy at least some, and possibly most, of the area of the hole at equilibrium pressure, i.e., when the first and second volumes are at substantially the same pressure. The moveable portion is moveable in response to a local pressure differential across the hole (i.e., between the front and back volume and thus across the membrane) so as to vary the size of the hole which is open to provide a flow path and hence varying the extent to which the vent allows for pressure equalisation between the volumes. In other words the moveable portion may, in equilibrium, effectively close at least part of the hole, but is moveable so as to vary to degree to which the hole is closed.

The moveable portion 202 may be defined by etching one or more channels 203 through the membrane material 101 such that the moveable portion is attached to the rest of the membrane 101 by one or more connection points 204 such that the moveable portion can be deflected from the rest of the membrane. The vent may be configured such that the moveable portion 202 is not substantially deflected, and thus remains closing the hole, at pressure differentials that are within the normal expected operating range of the MEMS transducer but to move to increase the size of the flow path, e.g. close less of the hole, at higher pressure differentials that could potentially cause damage to the membrane.

The top part of FIG. 2a illustrates the flexible membrane 101 in normal operation where the pressure in the second volume 110 is greater than the pressure in the first volume. The membrane 101 is thus deflected downwards from the membrane equilibrium position. However the pressure differential is within the normal expected operating range of the device, i.e., below an operating pressure threshold, and thus the moveable portions 202 of the variable vents 201 remain substantially closed. The lower part of FIG. 2 illustrates that the moveable portion 202 has been deflected from the rest of the membrane to expose the hole in the membrane and thus provide a flow path through the membrane. FIG. 2a illustrates two moveable portions of the membrane forming variable vent structures 201 but it will be appreciated that there may be more such vents in practice.

Such variable vent structures can thus be very useful for providing MEMS transducers, especially microphones, that can better survive high pressure events. Care does however need to be taken over the design of the variable vents, especially when formed in the membrane of the transducer. With the known variable vents there is typically a compromise between high-pressure relief and performance at acoustic pressures, in that if the vent opens to readily the acoustic performance of the transducer may be degraded but if the vent is too hard to open it may not provide sufficient extra flow during a high pressure event. Flow can be increased by increasing the number of vents but this can degrade the performance of the membrane or result in increased stress concentrations in areas of the membrane if too many vents are formed in the membrane itself. The vents could be formed in alternative flow paths, e.g. through side wall structures, but this typically adds the size and cost of the transducer structure, which can increase the area required for the transducer chip.

One skilled in the art will appreciate that MEMS transducers are typically formed on a wafer before being singulated. Increasingly it is being proposed that at least some electronic circuitry, e.g. for read-out and/or drive of the transducer, is also provided as part of an integrated circuit with the transducer. For example a MEMS microphone may be formed as an integrated circuit with at least some amplifier circuitry and/or some circuitry for biasing the microphone. The footprint of the area required for the transducer and any circuitry will determine how many devices can be formed on a given wafer and thus impact on the cost of the MEMS device. There is therefore a general desire to reduce the footprint required for fabrication of a MEMS device on a wafer.

According to the present invention there is provided a MEMS transducer comprising:
  a membrane layer; and
  at least one variable vent structure comprising:
    a vent hole for venting fluid so as to reduce a pressure differential across the membrane layer; and
    a moveable vent cover which, at an equilibrium position, at least partly blocks said vent hole;
  wherein the vent cover is moveable from said equilibrium position in response to a pressure differential across the vent cover so as to vary the size of a flow path through the vent hole; and
  wherein the vent cover comprises at least a first flap section and a second flap section, the first flap section being hingedly coupled to the side of the vent hole and the second flap section being hingedly coupled to the first flap section so as to be moveable with respect to the first flap section.

The second flap section may be coupled to the side of the vent hole only via the first flap section. The second flap section may be articulated to the first flap section.

In some embodiments the vent cover may be configured such that the extent to which the first flap section deflects away from equilibrium position for a given pressure differential is different to the extent to which the second flap section deflects away from the first flap section for the same pressure differential. The vent cover may be configured such that the second flap section deflects away from the first flap section more readily than the first flap section deflects away from equilibrium position. The vent cover may be configured such that, in use, for at least one pressure differential the amount of deflection of the second flap section with respect to the first flap section will be greater than the amount of deflection of the first flap section from equilibrium.

The first flap section may be coupled to the side of the vent hole via a first connection and the second flap section may be coupled to the first flap section by a second connection. The dimensions and/or geometry of the first connection and second connection may be different from one another. In some embodiments the first connection and second connection may each comprise a neck region and the dimensions of the neck regions may be different from one another. In some embodiments at least one of the first and second connections may comprise a beam structure and/or at least one of the first and second connections may comprise a plurality of connecting regions spaced apart along a hinging axis.

The first flap section may be coupled to the side of the vent hole for movement substantially about a first hinging axis and the second flap section may be coupled to the first flap section for movement with respect to the first flap section substantially about a second hinging axis, wherein the first and second hinging axes are parallel to one another. The first flap section may be coupled for movement about the first hinging axis in a rotational direction and the second flap section may be coupled for movement about the second hinging axis in the same rotational direction. Alternatively the first flap section may be coupled for movement about the first hinging axis in a rotational direction and the second flap section may be coupled for movement about the second hinging axis in the opposite rotational direction.

The first flap section may be coupled to the side wall on one side of the first flap section and may be coupled to the second flap portion on its opposite side.

In some embodiment the second flap section may be within the perimeter of the first flap section.

In some embodiment the area of the first flap section may at least 20% of the area of the vent cover. Additionally or alternatively the area of the second flap section may be at least 20% of the area of the vent cover.

The vent cover may be configured such that, in use, at least the first flap section is not substantially deflected from equilibrium position at pressure differentials below a first pressure threshold. The first pressure threshold may be at or above the expected normal operating pressure range for the MEMS transducer.

The vent cover may be configured such that, in use, the first flap section is substantially deflected from equilibrium position at pressure differentials above a second pressure threshold for the first section.

The vent cover may be configured such that, in use, the second flap section is substantially deflected from equilibrium position at pressure differentials above a second pressure threshold for the second section. The second pressure threshold may be within the normal operating expected operating pressure range for the MEMS transducer.

In some embodiments the vent cover may comprise at least one additional flap section, wherein the or each additional flap section is hingedly coupled to one of the first flap section or the second flap section or an intermediate additional flap section. The vent cover may be configured such that at least one additional flap portion is, in use, substantially deflected from its equilibrium position at pressure differentials within the expected normal operating range of the MEMS transducer.

The vent cover may be configured to provide a flow path size that varies, in use, with pressure within the normal expected operating range of the MEMS transducer so as to provide a variable sensitivity.

The vent hole may be formed in a first layer of material and the vent cover formed from the same material as said first layer. The vent cover may be defined by one or more channels through the first layer. The vent cover my be configured such that, at equilibrium position the first flap section and the second flap section lie substantially with the plane of the first layer. The first layer may be the membrane layer. In which case, for at least one vent, the vent hole may be located in the membrane layer outside the area of a membrane electrode. Additionally or alternatively for at least one vent the vent hole may be located in the membrane layer within the perimeter area of a membrane electrode in an area of opening in the membrane electrode.

The transducer may comprise a capacitive sensor. The transducer may comprise a microphone. The MEMS transducer may further comprise readout circuitry, which may for instance be integrated on the same die as the transducer structure.

In use the transducer may be located within a package having a sound port.

Embodiments also relate to electronic device comprising a MEMS transducer as described in any of the variants above. The device may be at least one of: a portable device; a battery powered device; an audio device; a computing device; a communications device; a personal media player; a mobile telephone; a games device; a wearable device; and a voice controlled device.

In another aspect there is provided a method of fabricating a MEMS transducer having a flexible membrane, the method comprising:

forming a structure having a flexible membrane; and forming at least one variable vent structure having a vent hole for venting fluid so as to reduce a pressure differential across the membrane layer, said at least one variable vent structure comprising a moveable vent cover which, at an equilibrium position, at least partly blocks said vent hole;

wherein the vent cover is moveable from said equilibrium position in response to a pressure differential across the vent cover so as to vary the size of a flow path through the vent hole; and wherein the vent cover comprises at least a first flap section and a second flap section, the first flap section being hingedly coupled to the side of the vent hole and the second flap section being hingedly coupled to the first flap section so as to be moveable with respect to the first flap section.

In a further aspect there is provided a MEMS transducer comprising:

a flexible membrane; and at least one variable vent structure wherein said variable vent structure provides a flow path having a size that varies with pressure differential across the membrane;

wherein said variable vent structure comprises at least one moveable portion which is moveable in response to a pressure differential across the moveable portion so as to vary the size of a flow path through the vent structure; and wherein said moveable portion comprises:
a first flap section;
a first hinge connection coupling the first flap section to a side of the variable vent structure such that the first section may be deflected away from an equilibrium position;
a second flap section; and
a second hinge connection coupling the second flap section to the first flap section such that the second flap section may be deflected away from the first flap section.

In a further aspect there is provided a MEMS transducer comprising:
a flexible membrane; and
at least one variable vent structure comprising a vent hole for venting fluid so as to reduce a pressure differential across the flexible membrane and a moveable vent cover which, at an equilibrium position, at least partly blocks said vent hole;
wherein the vent cover is moveable from said equilibrium position in response to a pressure differential across the vent cover so as to vary the size of a flow path through the vent hole;
wherein the vent cover comprises a first flap section coupled to a side of the vent hole and at least one second flap section coupled to the first flap portion,
the vent cover being configured such that the first flap section it is moveable from the equilibrium position and the second flap section is moveable with respect to the first flap section such that, for at least a first range of pressure differentials across the vent cover, the second flap section is deflected from its equilibrium position by a greater angle than the first flap section.

In a further aspect there is provided a MEMS transducer comprising:
a flexible membrane; and
at least one variable vent structure comprising a vent hole for venting fluid so as to reduce a pressure differential across the flexible membrane and a moveable vent cover which, at an equilibrium position, at least partly blocks said vent hole;
wherein the vent cover is moveable from said equilibrium position in response to a pressure differential across the vent cover so as to vary the size of a flow path through the vent hole;
wherein the vent cover comprises a first flap section coupled to a side of the vent hole so as to be moveable from the equilibrium position and at least one second flap section coupled to the first flap section so as to be moveable with respect to the first flap section,
wherein the resistance to movement of the second flap portion with respect to the first flap section is lower than the resistance to movement of the first flap section from equilibrium position.

In a further aspect there is provided a MEMS transducer comprising:
a membrane layer; and
at least one variable vent structure comprising:
a vent hole for venting fluid so as to reduce a pressure differential across the membrane layer; and
a dynamic vent cover which, at an equilibrium position, at least partly blocks said vent hole;
wherein the dynamic vent cover is moveable from said equilibrium position in response to a pressure differential across the vent cover so as to vary the size of a flow path through the vent hole; and wherein the vent cover comprises at least a first flap section and a second flap section, the first flap section being articulated to the side of the vent hole and the second flap section being articulated to the first flap section so as to be moveable with respect to the first flap section.

In a further aspect there is provided a MEMS transducer structure comprising:
a flexible membrane; and
a plurality of variable vents, each variable vent providing a flow path having a size that varies with pressure differential across the membrane;
wherein at least some of the variable vents have a profile of acoustic conductance with pressure differential that varies from one another.

At least one of the variable vents may at least partly open to provide a flow path at pressure differentials within the expected normal operating pressure range of the transducer. At least one of the variable vents may comprise a variable vent as described above, in any of the variants. Thus the variable vent may comprise a vent hole and a movable cover portion that is configured to at least partly block the vent hole at equilibrium. The moveable cover portion may comprise at least first and section sections as described above in any of the variants. Additionally or alternatively at least some of vents may comprise a vent cover that comprises a single section only, but the relative ease of opening of the cover portion of one vent may be different to the relative ease of opening of the cover portion of another vent. In some embodiments the transducer may, in use, be coupled to circuitry for signal processing a measurement signal from the transducer wherein the circuitry is configured to apply a compensation to the measurement signal to compensate for the variable acoustic conductance. The degree of compensation may therefore vary with the detected signal amplitude.

Any of the embodiments described above may be implemented in combination with any of the other embodiments and the various features described may be implemented in any combination in an embodiment.

BRIEF DESCRIPTION OF THE DRAWINGS

For a better understanding of the present invention, and to show how it may be put into effect, reference will now be made, by way of example to the accompanying drawings, in which.

DESCRIPTION

Figure 2A:
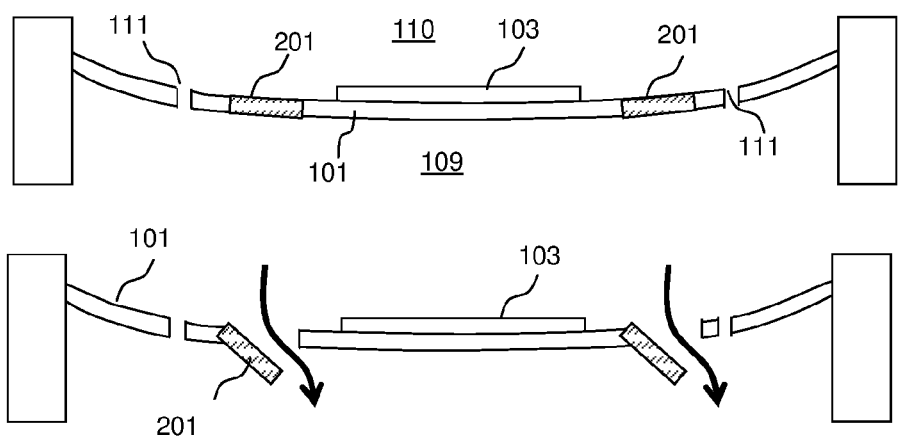
FIGS. 2a and 2b illustrate one example of known variable vents.
Figure 2B:
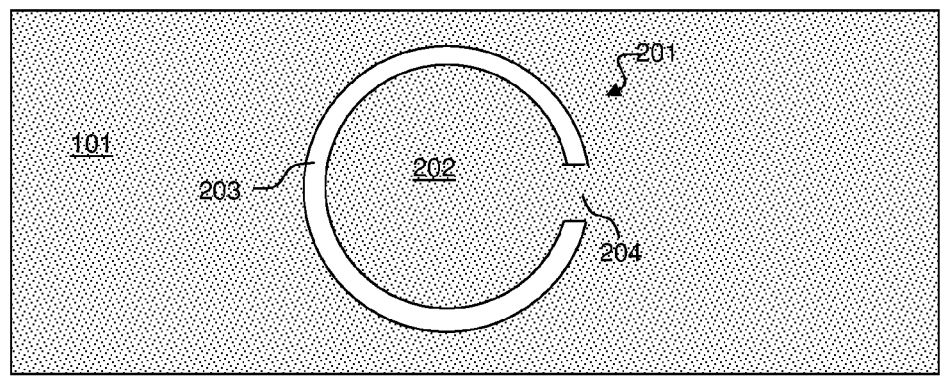

As mentioned above it has been proposed to use variable vents, for instance such as those illustrated with respect to FIGS. 2a and 2b, in a MEMS transducer structure to act as a type of pressure relief valve in high pressure situations, the vent opening to provide a larger flow path at high pressure differentials but having a smaller, if any, flow path at the pressure differentials within the normal operating range of the MEMS transducer. The vent structure is thus designed to be substantially closed in a first range of pressure differentials which corresponds to a normal range of operating pressure differentials for the transducer but to be open at a second, higher range of pressure differential to allow relatively significantly increased flow. Note that the closed position does not necessarily correspond to no flow and could correspond to a defined flow path size desired for normal operation, e.g. to provide at least some low frequency equalisation in the first range of pressure differentials. WO2014/045040 describes a number of different variable vent designs that may be used.

As mentioned however it can be difficult to achieve the correct balance between the vent remaining sufficiently closed within the normal operating range of the device so as to have minimal impact on the operation of the transducer, for instance the acoustic sensitivity of a MEMS microphone, whilst also opening to a sufficient extent in the high pressure situations to provide sufficient venting.

Some embodiments of the present invention thus provide variable vents with improved operating characteristics and/or which can provide a more tuned response to a given pressure differential.

Some embodiments of the present invention thus relate to MEMS transducers comprising a flexible membrane and having a variable vent structure that comprises at least one moveable portion which is moveable to provide a flow path that varies in size with pressure differential across the membrane. In embodiments of the present invention however the moveable portion has at least first and second sections or segments and the first section of the vent is moveable with respect to the second portion of the vent. In other words both the first and second sections of the moveable portion may be deflected away from an equilibrium position but in addition the second section of the moveable portion may be deflected away from the first section of the moveable portion. The first section may be coupled to the second section via a living hinge formed from the material of the moveable portion, as will be described in more detail below. Thus, rather than be arranged as essentially a single flap as with the variable vent described with respect to FIG. 2b, the moveable portion of embodiments of the invention may have at least two flap sections.

The moveable portion may be arranged with respect to a vent hole to at least partly act as a vent cover and at least partially block the vent hole at equilibrium position. The vent hole is a hole for venting fluid, e.g. gas such as air (although it could be other gases or fluids in some embodiments) so as to reduce a pressure differential across the flexible membrane layer. In some embodiments the vent hole may be formed in the membrane layer of the transducer. The moveable portion acts as a moveable or dynamic vent cover and may be deflected away from its equilibrium position by a sufficient local pressure differential across the cover. The first section of the moveable cover may be coupled to a side wall of the vent hole, e.g. the surrounding membrane material, such that the first section can be deflected, for instance rotationally deflected, from the equilibrium position. The first section may therefore be effectively hingedly coupled to the side of wall of the vent hole. The second section may be coupled, for instance articulated, to the first section so that the second section can be rotationally deflected with respect to the first section. The second section may therefore be effectively hingedly coupled to the first section. The second section may be connected to side wall of the vent hole only via the first section and thus its possible movement may be fully defined by the connection to the first section. Thus any deflection of the first flap section will result in a deflection of the second flap section but the second flap section will be free to adopt a position deflected from the first flap section subject to the pressure differential acting on it and the characteristics of the connection to the first flap section.

Providing a moveable portion as a vent cover, where the moveable portion or cover comprises at least two sections, where the second section is able to move with respect to the first section and where the movement of the second section may be wholly defined by its connection to the first section is advantageous as it allows the opening of the vent to be tuned more readily to a desired characteristic and can provide a better profile of acoustic conductance with applied pressure differential, as will be explained in more detail below.

Figure 3:
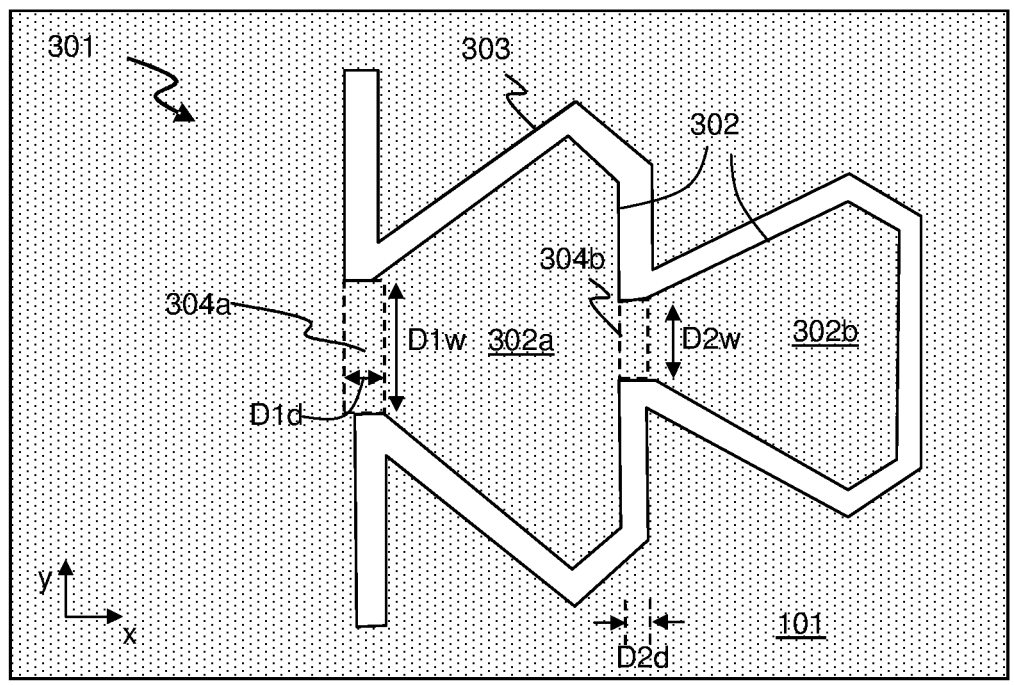
FIG. 3 illustrates a variable vent according to an embodiment of the invention.

FIG. 3 illustrates a variable vent structure 301 according to an embodiment of the present invention in plan view. In this embodiment at least one variable vent structure is formed in the membrane layer 101 and the flow path is thus a path through the membrane, however other arrangements are possible as will be described later. The variable vent structure may thus comprise a hole through the membrane 101 and part of the membrane is formed as a moveable portion 302 which acts as a vent cover and which provides a variable degree of blocking of the hole, subject to the local pressure differential.

The moveable cover portion 302 is defined by at least one channel 303 which runs through the membrane. The channel 303, which may be formed by etching through the membrane, is a thin channel and separates the moveable cover portion 302 from the rest of the membrane (other than via a connecting region 304a). Etching at least one channel 303 to partially separate the moveable cover portion 302 from the rest of the membrane 101 in this way means that the moveable cover portion 302 may be deflected away from the surface of the rest of the membrane.

In the embodiment of FIG. 3 the channel(s) 303 are configured not only to allow the cover portion 302 to be moveable with respect to the membrane 101 but also to allow a section of the cover to be moveable with respect to another section of the cover.

Thus in the embodiment of FIG. 3 the moveable portion or vent cover 302 comprises a first flap section 302a and also a second flap section 302b. The first flap section 302a is connected to the rest of the membrane 101 via a first connection defined by first flap section connecting region 304a, illustrated by the dashed area 304a. The second flap section 302b is connected to the first flap section 302a by a second connection, defined by a second flap section connecting region, illustrated as dashed area 304b. In this embodiment the first flap section 302a is thus the area defined by channel(s) 303 and connecting regions 304a and 304b, and which lies between the connecting regions. The second flap section 302b is the area defined by the channel(s) 303 and the second flap section connecting region 304b.

This first flap section connecting region 304a is defined by the channel(s) 303 so as to have a shape and size which allows the first flap section 302a of the moveable cover to be deflected away from the membrane in response to a high enough pressure differential acting on the membrane. The first flap section connecting region 304a provides an effectively hinged connection between the first flap section 302a and the rest of the membrane, which defines the side wall of the vent hole through the membrane. It will be appreciated that the hinged connection is formed from the same material as the membrane and first section 302a of the moveable cover, with the hinging being provided by removing material on either side of the connection such that the connection forms a neck portion. Such a connection is typically referred to as a "living hinge". As used in this specification the term living hinge will be taken to refer to a connection between parts of a material, where at least some material extends continuously from one part, through a connecting region to the other part, and which is configured to allow hinged-like relative movement of such parts by deformation of the continuous material. The first connection, formed by the first flap section connecting region 304a, is therefore effectively a hinge formed in the membrane material.

In this embodiment no special processing is required for the connecting region itself to form the living hinge, i.e., the connecting region need not be thinned or otherwise specially adapted, e.g. weakened. The first flap connecting region 304a is simply defined by the location of the channel(s) 303. Thus it will be appreciated that the dashed region 304a illustrated in FIG. 3 may comprise the same material, in the same thickness, as one either side. The dashed area thus just represents the area where relatively high deformation may occur in response to a sufficient pressure differential.

This first flap section connecting region 304a thus allows for hinged, i.e., rotational, movement of the first section 302a of the cover 302 away from the rest of the membrane in response to a sufficient pressure differential. It will be appreciated that in the embodiment of FIG. 3 the first section 302a of the moveable cover is thus effectively articulated to the rest of the membrane. As will be described later the first flap connecting region provides a resilient connection, i.e., forms a resilient hinge, and thus allows for the first flap section 302a to return to the equilibrium position in the absence of such a pressure differential.

As mentioned the second flap section 302b of the moveable cover is connected to the first section 302a by a second flap section connecting region 304b. This second flap section connecting region 304b is also defined by the channel(s) 303 so as to have a shape and size which allows the second section 302b of the moveable cover to be deflected away from the first section 302a in response to a high enough pressure differential. The second flap section connecting region 304b may likewise provide a living hinge connection between the first section 302a and the second section 302b and likewise no special processing is required for the second flap section connection region 304b which likewise may form a neck portion. This second flap section connecting region 304b thus also allows for resilient rotational or pivotal, i.e., hinged movement of the second section 302b away from the first section 302a. The second connection, formed by the second flap section connecting region, is thus effectively another hinge formed in the membrane material and the moveable cover portion thus comprises a plurality of hinges. It will be appreciated that in the embodiment of FIG. 3 the second section 302b of the moveable cover is thus effectively articulated to the first section 302a and is only connected to the rest of the membrane via the first section 302a.

Both the first and second sections 302a and 302b of the moveable cover portion 302 are preferably arranged such that their equilibrium positions, i.e., the positions that they adopt when there is no substantial pressure difference acting on the variable vent structure, are substantially within the plane of the membrane. In other words, at equilibrium, the first section 302a of the cover 302 is not substantially deflected away from the rest of the membrane and the second section 302b is not substantially deflected away from the first section 302a. Therefore, in equilibrium position the cover 302 substantially covers or blocks at least part of the flow path through the membrane. In this embodiment the flow path is substantially completely closed at equilibrium position but in some embodiments the vent may be designed to provide a certain defined flow size at equilibrium.

It will of course be appreciated that the channel 303 does represent a path for air to flow through the membrane, however the channel 303 may be formed with a very narrow width and thus there may be no or very limited air flow through the channel when the both sections 302a and 302b of the moveable cover 302 are in equilibrium position. The width of channel 303 may be limited by the photolithographic process constraints on the minimum etchable gap, or the need for some mechanical clearance for the moveable sections(s) to bend and flex yet clear the rest of the structure. Also narrow gaps will tend to have a larger fractional manufacturing tolerance, leading to a wider variation in the acoustic impedance when closed and thus a wider variation in of e.g. the low-frequency roll-off a microphone. A typical width might be 1 um, relative to a typical vent structure of 20 um to 50 um in extent. However the width might be, for example, ten times smaller or larger depending on the acoustic specifications or the manufacturing process capability.

Figure 4:
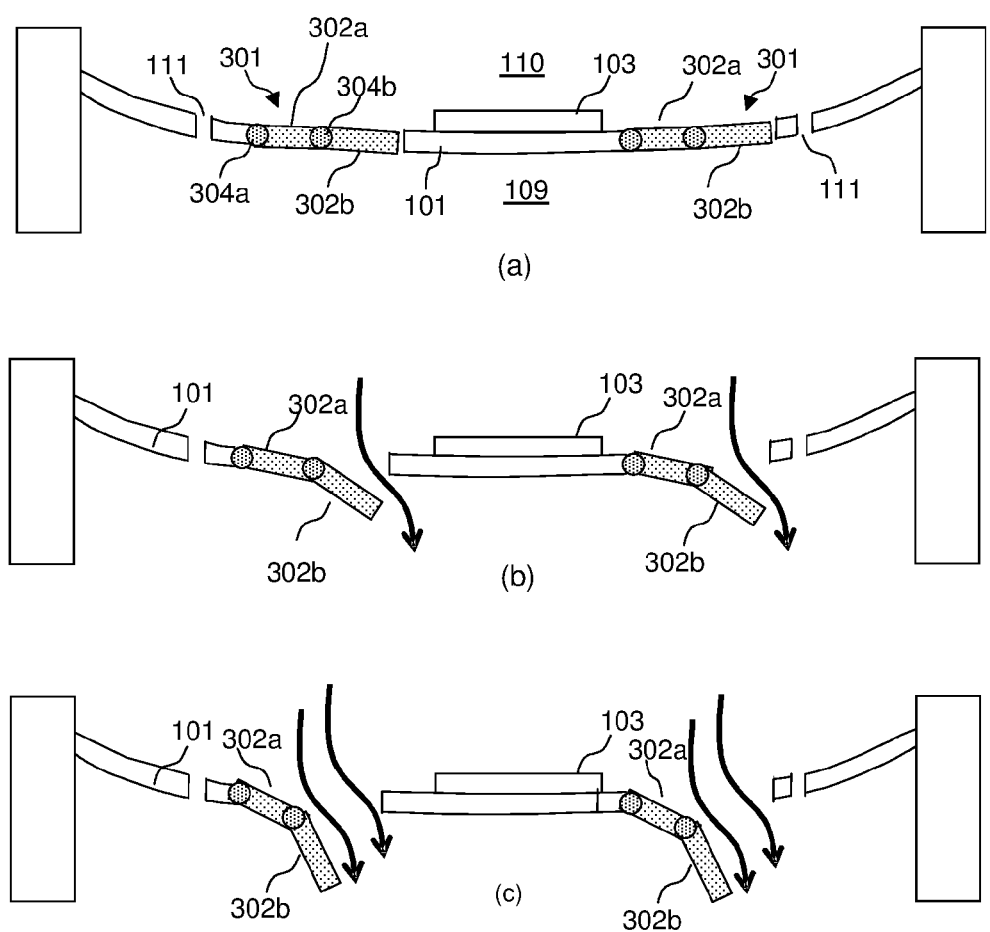
FIG. 4, views (a), (b), and (c), illustrates operation of a vent according to an embodiment of the invention.

In response to an increasing pressure differential across the membrane the first and second sections 302a and 302b of the cover 302 may be displaced from the equilibrium position. FIG. 4 illustrates how such a variable vent may operate in a MEMS transducer. Similar components to those discussed previously in relation to FIGS. 1 and 2 are identified using similar reference numerals. FIG. 4 thus illustrates the flexible membrane 101 of a transducer with the rest of the transducer structure being omitted for clarity. The membrane is supported between a first volume, which includes cavity 109, and a second volume, which includes cavity 110.

Again the membrane may have a plurality of bleed holes 111 which are dimensioned and arranged to produce a tuned effect on the transducer and reduce the impact of low frequency pressure variations. The membrane 101 is also provided with a plurality of variable vent structures 301 are described above. In some applications it may be possible to use a single variable vent structure, but, as will be discussed later, it may be beneficial to provide the membrane with a plurality of variable vent structures. In this embodiment the variable vent structures 301 are separate from and different to the bleed holes 111.

FIG. 4 shows the variable vent structures 301 being located in the membrane outside of the area of the membrane electrode 103. This means that the vent may be formed just from the materials of the one or more layers forming the membrane 101. However, in some embodiments it would be possible to form the variable vent structure within the area of the electrode, for instance in exclusion areas within the overall area of the electrode where no metal electrode is deposited. Alternatively, the variable vent structure could be formed in the area of the electrode with the membrane and electrode layers together forming the variable vent structure. In some applications, forming the moveable section of the vent from the membrane layer and, at least partly, from the metal electrode layer may provide a stronger moveable portion.

It should be noted however, that wherever the variable vent structure is formed there may be one or more additional materials coupled to the membrane at that location so as to tailor the properties of the variable vent, for example the flexibility or stress handling capability.

FIG. 4, view (a) illustrates the situation in operation where the pressure in the second volume 110 is greater than the pressure in the first volume, but within the expected safe operating or normal pressure range. The membrane is thus deflected downwards from the membrane equilibrium position. However, the pressure differential is within the normal expected operating range of the device, i.e., below an operating pressure threshold, and thus the variable vents 301 remain substantially closed.

FIG. 4, view (b) illustrates the situation where the pressure differential has increased to a sufficient level to cause displacement of the moveable cover portion 302. FIG. 4, view (b) shows that the first section 302a may be partly deflected, i.e., rotated away from the membrane 101 and that the second section 302b is itself deflected away from the first section 302a. This provides a degree of opening of the vent hole and thus increases the flow path allowing for a more rapid pressure equalisation.

FIG. 4, view (c) illustrates the situation where the pressure differential has increased further to a sufficient level to cause the significant deflection of the first section 302a from the membrane. This also causes a further deflection of the second section 302b and results in the variable vent structures 301 being opened further. This increases the size of the flow path significantly allowing for an even more rapid pressure equalisation.

As the moveable portion includes the second section 302b which is hingedly coupled to the first section 302b and which is not otherwise connected to the rest of the membrane, the second section 302b can be displaced both away from the first section 302a and can be displaced away from equilibrium by displacement of the first section 302a. This double deflection means that the second section 302b can advantageously benefit from any displacement of the first section 302a to provide a greater degree of opening than would be the case with a single flap portion.

For example consider that in response to a given pressure differential across the membrane that the first section 302a will be deflected away from the rest of the membrane through an angle α. The proximal end of the first section 302a will be connected to the membrane at the first connection 304a, i.e., at a first hinge, but the distal end of the first section will be displaced and, depending on the extent of the angle α may be displaced out of the plane of the membrane, thus exposing at least part of the flow path through the membrane. In the embodiment of FIG. 3 the second section 302b of the cover 302 is connected, by the second connection 304b, i.e., by a second hinge, at or near the distal end of the first section 302a and is connected to be effectively hinged about an axis which may be parallel or relatively near to parallel to the hinge axis of connection 304a. Thus the second section is deflected away by an angle β from the first section and thus lies at an angle of α+β from the plane of the membrane (where β may be the same or different to α). It will clear than this will result in a greater degree of opening of the vent than would be the case if the second section 302b were not separately moveable with respect to the first section 302a and thus the whole cover were simply at an angle of α.

Further the properties of the first hinge connection 304a and the second hinge connection 304b can be designed to provide a desired overall response. In other words the first and second hinge connections 304a and 304b may be configured so that the extent to which the first section 302a deflects away from the membrane 101 for a given pressure differential is different to the extent to which the second section 302b deflects away from the first section 302a for the same pressure differential.

FIG. 3 illustrates that the first section 302a may be connected to the membrane 101 by a first flap section connecting region 304a which in this embodiment is a first neck. As illustrated in FIG. 3 this neck region can be seen as having a first width or lateral extent of D1w, i.e., a dimension across the neck which, in this instance, is substantially parallel to the axis about which the region deforms, e.g. a hinging axis. In FIG. 3 the width of the neck can be seen as the dimension of the neck in the y-axis of the figure, i.e., vertical dimension as shown. The first neck also has a depth D1d, i.e., a dimension of the longitudinal extent of the neck region between the two parts it connects, which can be seen as the x-axis (horizontal) dimension in FIG. 3. The second section 302b is connected to the first section 302a by the second connecting region 304b, i.e., a second neck. This second neck has a width D2w and a depth D2d. The first connecting region or neck 304a may have different dimensions to the second connecting region or neck 304b. For instance the width D1w of the first region 304a may be different to the width D2w of the second connecting region. The different widths of the connecting regions 304a and 304b may mean that the ease to which the relevant section can be deflected from the part it is connected to varies. For example the width D2w may be smaller than the width D1w such that the second section 302b may be more readily deflected away from the first section 302a than the first section 302a may be deflected away from the rest of the membrane 101. Additionally or alternatively the depth of the connecting regions as defined by the channel(s) 303 may be different for the first and second connecting regions 304a and 304b.

It should be noted that in some embodiments the connecting regions may have other geometries and may for instance include torsion beams structures or the like as will be described in more detail later. Such structures have different and/or additional dimensions that determine the relative ease of deflection. In addition in some embodiments a connection may be formed by more than one connecting region spaced apart along a hinging axis and the number of such regions may also determine the relative ease of opening. In general however it will be understood that the dimensions and/or geometries of the connections may be designed to ensure that one flap section, e.g. the second flap section 304b, is more readily deflected than another flap section, e.g. the first flap section 304a, for a given pressure differential.

Such an arrangement, where the second section is more easily deflected than the first section may provide a particularly advantageous response for a variable vent.

Figure 5A:
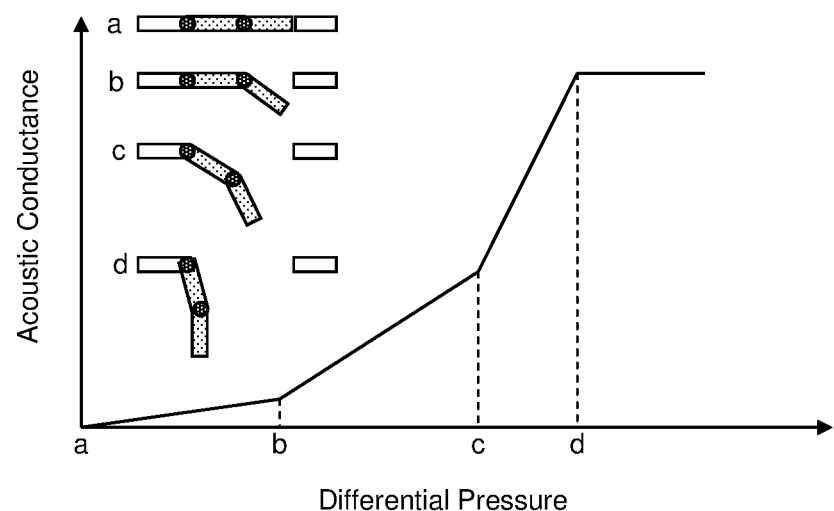
FIGS. 5a, 5b and 5c illustrate how the acoustic conductance and displacement of the vent may vary with pressure.

FIG. 5a illustrates a graph of acoustic conductance against differential pressure. The acoustic conductance represents how readily air may flow between the two volumes and thus is related to the extent of opening of the flow path, i.e., the extent to which the hole through the membrane is exposed, against pressure differential.

FIG. 5a also illustrates example of the relative positions of the sections 302a and 302b of the moveable vent cover 302 with respect to the membrane 101 (in cross section) at four particular pressure differentials, indicated a, b, c and d.

At equilibrium (condition a), i.e., no substantial pressure differential across the membrane, both the first and second sections 302a and 302b lie generally in line with the membrane and thus the flow path is substantially closed. In the embodiment of FIG. 3 this means that substantially only the channels 303 defining the flap portion provide any flow path through the variable vent. Thus the acoustic conductance is low, or substantially zero if the channels defining the flap portion are small enough. As previously mentioned however in some embodiments it may be desirable to have a certain defined non-zero size flow path at equilibrium. At low pressure differentials across the membrane there may be no substantial deflection of either section of the moveable cover 302.

As the pressure differential increases the moveable cover may start to be deflected. In this example the connecting regions 304a and 304b are designed such that the second section 302b deflects more readily that than the first section 302a. The second section 302b may therefore start to be deflected but at relatively low pressure differentials the first section 302a of the moveable cover is not substantially deflected from its equilibrium position. As the second section 302b of the moveable cover deflects at least part of the flow path is opened and thus the acoustic conductance through the vent may increase. The amount of opening is quite limited however until the first section 302a also starts to deflect (at pressure differential b). Thus the acoustic conductance below pressure differential b is still low.

At higher pressure differentials (above pressure differential b) the first section 302a of the moveable portion is also deflected. This not only starts to open the section of the flow path previously blocked by the first section 302a but the deflection of the first section also results in further deflection of the first section resulting in a greater opening of the flow path. The acoustic conductance thus increases relatively rapidly with increasing pressure differential in this zone of operation, i.e., between pressure differentials b and c.

As the amount of deflection of both the first and second sections of the moveable cover increases the area of unblocked flow path increases until, at pressure differential d, both moveable portions are moved further out of the area of the flow path and the vent is fully open with a defined maximum flow area. Even if the pressure differential increases further the size of the flow path will not increase any further. In practice however in some embodiments, the moveable portions may not be deformable to the full extent shown with respect to pressure differential d.

An arrangement with a plurality of hinges wherein the vent remains substantially closed (e.g. somewhere between positions a and b for the example) during the pressure differentials expected in normal operation of the transducer and only starts to open significantly (i.e., extend beyond position b) when the pressure differential reaches unusually high levels or starts to approach levels that may potential cause damage to the transducer is advantageous. It will be appreciated that having a flow path through the membrane could alter the operating characteristics of the transducer. As discussed above in relation to FIG. 1 in a MEMS microphone there may be one or more bleed holes though the membrane to reduce the impact of low frequency effects. The number and dimensions of these holes are, by design, chosen to provide a desired operating characteristic. These bleed holes thus already provide a path for equalising the pressures in the two volumes on either side of the membrane, but these holes are deliberately designed such that such equalisation takes a long time in acoustic terms. Thus the bleed holes alone do not prevent large pressure differentials from causing damage to the transducer. The variable vents are provided to enable more rapid equalisation. However were the variable vents to be open to provide a significant flow path at the expected normal operating pressure differentials such additional flow paths would alter the frequency characteristics of the transducer and could result in distortion.

Figure 5B:
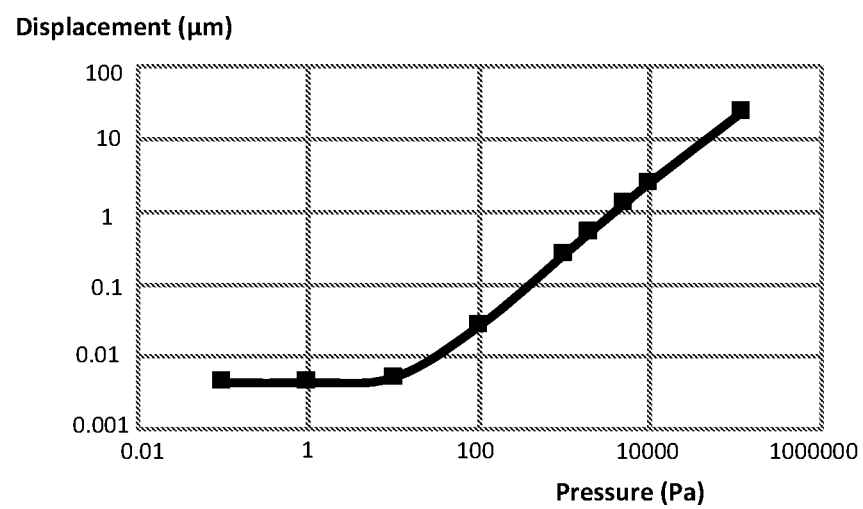

The acoustic conductance versus applied differential pressure profile illustrated in FIG. 5a can be tuned to a desired characteristic more readily than a single flap vent according to the previously known designs. Thus for example the connection 304a connecting the first section 302a to the membrane may be arranged so as to not substantially open, i.e., such that the first section 302a does not substantially displace from its equilibrium position, until a pressure level is reached which is above the normal operating range but which is below a pressure level where damage may occur. The connection 304b between the first and second sections may be configured however so that the second section deflects more readily, i.e., at lower pressure differentials. Thus the region of operation between a and b in FIG. 5a may include some of the normal expected operating range of the transducers, however it will be seen that the acoustic conductance remains low in this region and thus the effect on sensitivity of the transducer is low. FIG. 5b illustrates a log plot of displacement of the moveable cover against pressure (differential) for an example vent structure similar to the design illustrated in FIG. 3. The degree of opening at a sound pressure level of 140 dB SPL may be of the order of 0.03 µm for example. Thus the vent can be considered to be substantially closed at SPLs up to this limit. Once pressure level b is reached however the vent opens rapidly because of the presence of both the first and second flap sections of the cover.

Figure 5C:
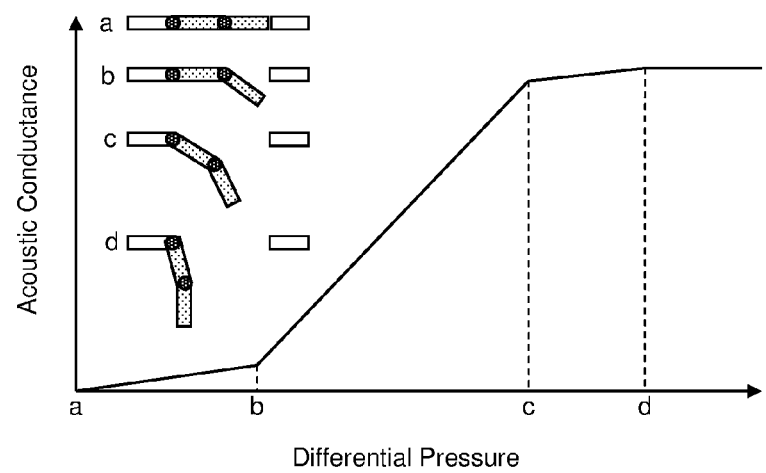

This design of vent thus can provide limited impact at the normal operating range of pressures but can open more rapidly at the pressures of interest where venting is required in order to prevent signal distortion and/or membrane damage. It will be appreciated that the exact profile of acoustic conductance with pressure differential will depend on various factors, such as the sizes of the different sections of the moveable cover portion and the relative ease of opening of these sections. For instance FIG. 5c illustrates a slightly different profile of acoustic conductance with differential pressure that could be provided by a different vent design. The vents may be designed to provide a desired profile of acoustic conductance. Various vent designs may be simulated to check they will, in use, provide the desired profile.

The moveable cover portion of the variable vent may be configured such that there is substantially no movement of the moveable cover portion from the equilibrium position, i.e., of either section, at pressure differentials below a first pressure threshold for the cover. In particular the moveable cover portion may be deflected by less than the width of the membrane so that the trailing surface (i.e., the surface on the opposite side to the direction of deflection) of the second section 302b of the moveable cover does not substantially extend beyond the membrane surface. Thus the flow path, i.e., hole through the membrane, remains largely blocked by the moveable cover 302.

The first flap section 302a of the moveable cover 302 may be configured such that there is no substantial deflection of the first flap section away from the membrane below a first pressure threshold, which will be referred to as a first pressure threshold for the first section. In other words the part of the vent hole occupied by the first flap section at equilibrium position remains substantially blocked by the first flap section at pressure differentials below the first pressure threshold for the first section. The first pressure threshold for the first section may be at or above the upper end of the normal expected operating pressure range of the MEMS transducer. Likewise the second flap section 302b of the moveable cover 302 may be configured such that there is no substantial deflection of the second flap section away from the first section below a pressure threshold, which will be referred to as a first pressure threshold for the second section. Thus the part of the vent hole occupied by the second flap section at equilibrium position may remain substantially blocked by the second flap section at pressure differentials below the first pressure threshold for the second section (assuming no significant movement of the first flap section). The first pressure threshold for the first section may the same as or different to the first pressure threshold for the second section. In particular the first pressure threshold for the first section may be greater than the first pressure threshold for the second section.

For acoustic transducers and the like the first cover threshold, and/or at least one of the first pressure thresholds for the first or second sections may, for example, be greater than 150 Pa and may be greater than 200 Pa or higher and could, in some applications be greater than 1 kPa. In other words the variable vent may remain substantially closed at pressure differentials up to about 150-200 Pa or higher. Thus the variable vent may provide substantially no significant variation in flow path size for pressure differentials in the range of 0-200 Pa. This means that the variable vent has minimal performance impact on the operation of the transducer.

The variable vent is arranged to open to provide a flow path at pressure differentials which approach the pressure differentials that may cause damage to the transducer. For instance the variable vent may be arranged to be open enough to provide a significant flow path for venting at a pressure differential of around 100 kPa. Thus the moveable cover portion 302 may be configured such that there is substantial movement of the cover portion from the equilibrium position at pressure differentials above a pressure threshold, which will be referred to as a second cover pressure threshold.

The first section 302a of the moveable cover 302 may be configured such that there is substantial deflection of the first section away from the membrane above a pressure threshold, which will be referred to as a second pressure threshold for the first section. Thus the vent cover may be configured such that, in use, the part of the vent hole occupied by the first flap section at equilibrium position is substantially unblocked by deflection of the first flap section at pressure differentials above a second pressure threshold for the first section. The second section 302b of the moveable cover 302 may be configured such that there is substantial deflection of the second section away from the first section above a pressure threshold, which will be referred to as a second pressure threshold for the second section. The second pressure threshold for the first section may the same as or different to the second pressure threshold for the second section. In particular the second pressure threshold for the first section may be greater than the second pressure threshold for the second section. It will be appreciated that the second pressure threshold for the first or second section will be greater than the respective first pressure threshold.

For acoustic transducers and the like the second cover pressure threshold and/or at least one of the second pressure thresholds for the first or second sections may be equal to or greater than 100 kPa. Thus the variable vent provides substantially a significant increase in flow path size for pressure differentials of at least range of 100 kPa, compared to the flow path size at equilibrium.

The pressure differential at which the each of the sections 302a and 302b of the moveable cover 302 will start to deflect significantly will depend on various factors such as the thickness and composition of the material forming each section, e.g. the membrane and also (for a flap arrangement) the dimensions of the connecting regions for the respective sections, e.g. the widths D1w, Dw2 and/or the depths D1d, D2d.

Referring back to FIG. 4 it will be appreciated that the material of the membrane 101 is relatively resilient. Thus if the pressure in the second cavity stops increasing then, after a short time, the venting through the variable vents 301 will reduce the pressure differential to a level at which the variable vents return to the closed position shown in FIG. 4, view (a). In other words the flap sections 304a and 304b are connected by resilient connections 304a and 304b such that when the pressure differential reduces the flap sections move back towards their equilibrium positions.

If the pressure in the second cavity were then to reduce relatively quickly the pressure differential across the membrane in the opposite direction may increase, such that the membrane is deflected upwards. The pressure differential may increase to such an extent that the vents now open in the upward direction to vent air from the first volume into the second volume. It will thus be appreciated that the variable vents may be bi-directional and allow venting from the first volume to the second volume and vice versa.

It will be seen from FIG. 4, view (b) and FIG. 4, view (c) that when the variable vent is open the moveable cover portion 302, and especially the second section 302b, will be deformed away from the surface of the membrane—in the same direction that the membrane is deflected. Thus the moveable cover portion may extend further than any part of the membrane itself. In some embodiments the membrane may be arranged relative to the rest of the transducer structure, such as the back-plate or some structure of the substrate, such that the membrane may make contact with the transducer structure. In some instances this may be beneficial in preventing too much travel of the membrane. Clearly the variable vents need to be able to open to provide the advantages described above and thus the variable vents are preferably arranged with regard to the transducer structure so that the transducer structure will not prevent the vents from opening sufficiently. Also it may be preferred that there is no structure immediately within an outlet path for the vent when open. In some instance the vents may be arranged on a part of the membrane such that the vents will not come into contact with the transducer structure. For example with regard to the back-plate the vents may be arranged so that the moveable cover portions of the vents open into an area of one or more of the back-plate acoustic holes. In other embodiments however the vents may be arranged such that they can open sufficiently to provide a significant flow path but are prevented from opening any further by the transducer structure. Thus the transducer structure may act as a hard stop for the moveable portions of the vent which may reduce or limit the stress in the moveable portions and help prevent damage to the moveable portions.

The variable vent structures of embodiments of the present invention thus provide all of the benefits of the variable vent structures having moveable portions as described in WO2014/045040 but advantageously offer a better performance in terms of acoustic conductance, i.e., air flow, over the range of pressure differentials of interest. In other words the vents according to the present invention can more readily be tuned to provide a desired low acoustic conductance at a first lower range of pressure differentials but with a sufficiently high acoustic conductance at a higher range of pressure differentials. The variable vent structures may be used in any of the ways described previously in WO2014/045040, the contents of which is hereby incorporated by reference.

For instance the description above has focussed on the vent being in the membrane and providing a flow path between the volumes on either side of the membrane of the transducer, e.g. front and back volumes. It will be appreciated however that the vent could be arranged in some side channel or port, for instance through a side wall structure and in some embodiments may provide venting from one volume but not to the second volume, e.g. via a channel to an atmosphere outside the MEMS package in use. Thus the vent may be formed in a layer of material which does not form part of the flexible membrane.

It will be understood that the moveable cover portion of the vent and the individual sections of this cover portion may take various forms. For example the vent structure may be altered in order to provide a different pressure differential response, or to avoid stress build up problems.

Figure 6:
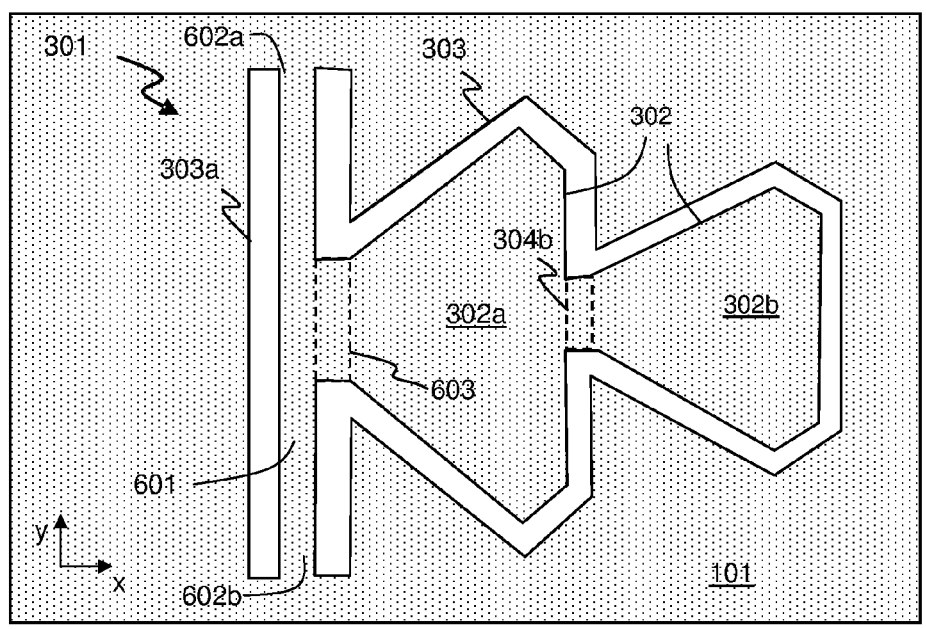
FIG. 6 illustrates a further embodiment of a variable vent.

For example, FIG. 6 shows a variable vent 301 which is similar to that described above with reference to FIG. 3 but where the channel(s) 303 defining the moveable cover portion include channel 303a which defines that the first section 302a is connected to the rest of the membrane 302a via a beam structure 601. It will be appreciated that when subjected to a pressure differential which is sufficient to cause the moveable cover portion to deform there will be significant stress on the connecting portion(s). The use of a beam structure can help reduce the stress concentration occurring during deformation.

The beam structure 601 is coupled to the membrane at its ends 602a and 602b and supports the moveable cover portion 302. In this embodiment the first flap section 302a is connected to the beam 601 via a neck region 603. Collectively the beam 601 and neck region 603 provide the first flap connection. As with the embodiments described previously a sufficient pressure differential acting on the membrane, and hence on the first section 302a of the moveable cover portion 302, can deflect the first section 302a of the moveable cover portion 302 out of the plane of the membrane. In this embodiment however deflection occurs, at least partly, due to a twisting of the beam 601, rather than just an out of plane bend of the neck portion 603. The beam 601 thus acts as a torsional beam. The stress and deflection of the first section 302a of the moveable portion is thus at least partly controllable via the dimensions of the torsion beam 601. This can allow the same degree of deflection as the embodiments discussed previously but with the advantage of lower stress and hence less likelihood of damage—or alternatively allow a greater degree of opening for a given pressure differential.

As mentioned in this embodiment the connection between the first flap section 302a and the rest of the membrane includes the neck portion 603 and the beam 601. The neck portion may be configured in this instance such that there is no significant bending at the neck portion and all deflection comes from twisting of the torsional beam 601. In other embodiments however the torsional beam may twist and the neck portion 603 may also provide some bending.

It will be clear that this connection still provides a hinged connection between the first section 302a of the moveable cover 302 and the membrane in that the first section moves generally rotationally with respect to a hinge axis, which in this case is along the length of the beam 601. The torsional beam thus forms part of a living hinge structure. In this embodiment the dimensions of the beam, e.g. length along the hinging axis (i.e., the y-axis in FIG. 6) and/or the breadth of the beam (e.g. x-axis dimension in FIG. 6)

It will be understood that the known variable vent structures based on a moveable portion, i.e., such as described in WO2014/045040, may include designs wherein the moveable portion is connected to the membrane by one or more arm structures such as torsional beams. However, in such cases the arms are part of the connection that allows the moveable portion to move and there is a single flap portion.

In embodiments of the present invention there is at least a first flap section which is hingedly coupled, e.g. through a living hinge, to the substrate. The first flap section is a relatively significant part of the cover, i.e., in terms of area, whose movement has a relatively significant effect on the flow path through the vent. For example the area of the first flap section may be at least 10%, or at least 20%, or at least 30% of the total area of the moveable cover. The first flap section is coupled to the side wall of the vent, e.g. the surrounding membrane, on one side of the section only. The first flap section is thus coupled for a rotational motion generally about a first axis. The moveable cover portion also includes at least a second flap section which is coupled to the first flap section. The second flap section is also a relatively significant part of the cover whose movement has a relatively significant effect on the flow path through the vent. For example the area of the second flap section may be at least 10%, or at least 20%, or at least 30% of the total area of the moveable cover. The second flap section is hingedly coupled to be moveable, e.g. rotationally movable, with respect to the first flap section. In some embodiments the second flap section is coupled to the first flap section such that a given pressure differential will cause rotational movement of the first flap section from the membrane in a first rotational direction and also rotational movement of the second flap section from the first flap section in the same rotation direction. Thus referring back to FIG. 4 for example it can be seen that the illustrated pressure differential in FIG. 4, view (c) causes the first section to deflect in a clockwise direction with respect to the membrane and also causes the second section to deflect in a clockwise direction from the first flap section.

It will of course also be appreciated that referring back to FIG. 3 the connecting regions 304a and 304b and the first and second flap sections 302a and 302b may all comprise the same material in the same thickness and thus the different sections are defined by the channel(s) 303 and how the various sections behave. One skilled in the art will appreciate that the first and second flap sections are each sections that may be substantially continuous sections and that are designed to move as a single section, i.e., like a plate section.

Of course as a flap section may be formed out of the same material as the membrane, which is partly flexible at the pressures of interest, then the flap section may experience some curving or deformation in use when subject to a pressure differential. However the radius of curvature of such curving will be relatively large or equivalently across the section the curvature will be relative low.

The connecting regions between the flap sections or between a flap section and the membrane are designed however to provide relatively high curvature in response to a pressure differential of interest. In other words the connection may be a living hinge which may be an area where there is a relatively high degree of deformation in use in response to a sufficiently high pressure differential.

FIGS. 7a to 7e show further different potential variable vent structures.

Figure 7A:
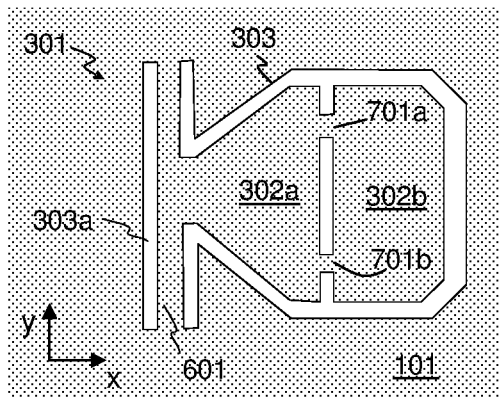
FIGS. 7a to 7e illustrate additional embodiments of variable vents.

FIG. 7a shows a variable vent structure in plan view where the first flap section 302a is connected to the membrane via a beam structure 601 as described above. In this embodiment however the second flap section 302b is connected to the first section 302a by a hinged connection that has separate regions of connection 701a and 701b. This may help to strengthen the connection between the two sections of the moveable cover 302, and may assist in avoiding any potential twisting of the hinge. It will be appreciated however the second section 302b is still connected on one side only, i.e., is articulated, and the connection is a hinged connection. The two second flap section connecting regions 701a and 710b are spaced apart from one another along the hinging axis. As mentioned above the number of such connecting regions, as well as their dimensions, will influence the relative ease of deflection of the second flap section away from the first flap section.

Figure 7B:
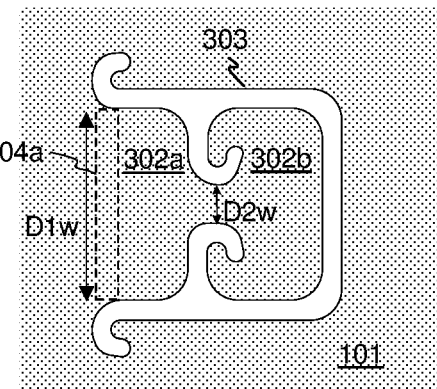

FIG. 7b shows a variable vent structure where the ends of the channels defining the moveable portions and hinge portions are rounded to avoid stress concentrations. In this embodiment the first flap section connecting region 304a is of substantially the same width, W1w, as the rest of the first section 302a. It will be understand however that such a connection region can still form a living hinge and, in use with a sufficient pressure differential, will exhibit a relatively high curvature.

Figure 7C:
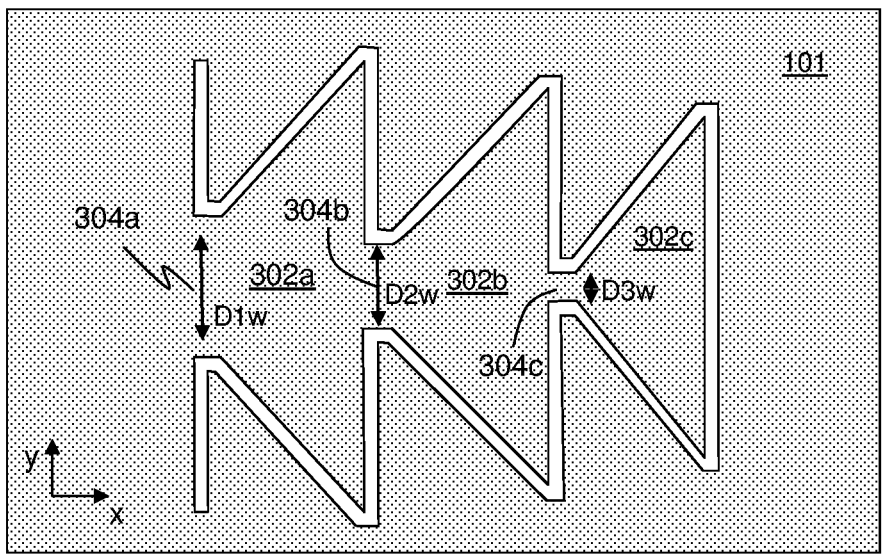
Figure 7C:
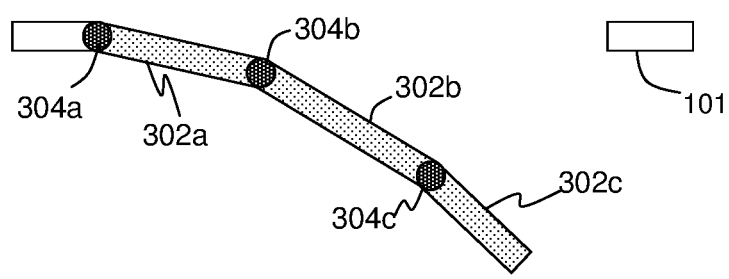

The embodiments discussed above have been described with two flap sections of the moveable cover, i.e., just the first and second sections. In some embodiments however there may be more than just two sections. In some embodiments therefore there may be at least a third section which is hingedly coupled to the rest of the moveable cover. The third section may be hingedly coupled to the second section, e.g. on generally the opposite side to the connection with the first section. FIG. 7c illustrates such an embodiment, both plan view (of the closed vent) and a side view of the vent partly open. It can be seen that in addition to the first and second sections 302a and 302b of the moveable cover portion a third section 302c is coupled to the second section 302b by a connection 304c. As mentioned above the relative ease of deflection of the third section 302c may be different to that of the first section 302a and/or the second section 302b.

In some embodiments however the third section could be hingedly coupled to the first section, i.e., the second and third sections are separately coupled to the first section. It will be appreciated that there may be more than three sections.

Figure 7D:
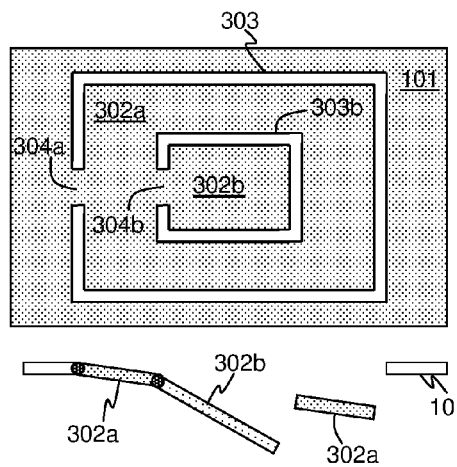
Figure 7E:
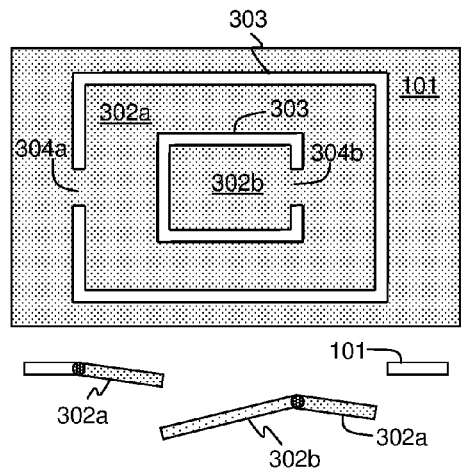

FIGS. 7d and 7e illustrate further embodiments, in both plan view of the closed vent and in sectional view of the vent partly open (along a horizontal centreline of the plan view). In the embodiments of FIGS. 7d and 7e the second flap section 302b is formed as a flap section within the perimeter of the first flap section 302a. In these embodiments channel 303 defines the outer area of the first flap section 303 which is connected to the rest of the membrane by first flap connecting region 304a. In addition a channel 303b is formed within the perimeter of the first flap section 302a to form a second flap section 304b connected to the first flap section by second flap section connecting region 304b. In this way the second flap section 302b is nested within the perimeter of the first flap section 302a. The second flap connecting region 304b may form a resilient living hinge as described above. As with the other embodiments the second flap section 302a may be configured so that the ease of deflection of the second section 302b away from the first section is different to the ease of deflection of the first section 302a from the rest of the membrane 101. It will be appreciated that like the other embodiments the second flap section 302b is articulated to the first flap section and is connected to the rest of the membrane only via the first flap section 302a.

In the embodiment illustrated in FIG. 7d the second flap section 302b is connected for rotation in substantially the same rotational direction as the first flap section 302a. As can be seen from the sectional view, if the first flap section 302a is deflected downwards in a clockwise sense the second flap section 302b may also be deflected away from the first section in the clockwise sense. In other words the second flap section 302b is connected to the first flap section 302a on the same relative side, i.e., the left hand side in the figure, as the first flap section 302a is connected to the rest of the membrane 101.

In the embodiment illustrated in FIG. 7e the second flap section 302b is connected for rotation in substantially the opposite rotational direction as the first flap section 302a. Thus as can be seen from the sectional view, if the first flap section 302a is deflected downwards in a clockwise sense the second flap section 302b may actually be deflected away from the first section in the anticlockwise sense. In this embodiment the second flap section 302b is connected to the first flap section 302a on the opposite relative side as the first flap section 302a is connected to the rest of the membrane, i.e., the first flap section 302a is connected on its left hand side in the figure whereas the second section 302b is connected on its right hand side. It will be appreciated that in such an embodiment the angular deflection of the second section 302b away from its equilibrium will not benefit from any deflection of the first section 302a, and in fact deflection of the first section 302a may reduce the angular deflection of the second section 302b, however such an embodiment may provide a desired tuned response in some applications and as can be seen from FIG. 7e allow venting through both sides of the open vent which may be beneficial in some embodiments.

It will be appreciated that any of the examples described above may be used in various combinations, for instance there may be more than one nested flap section, e.g. there could be a third flap section nested within the perimeter of the second flap section and/or a flap section having a nested arrangement may be coupled on one side to a different flap section, which may or may not itself have a nested flap arrangement. In addition the embodiments describes above indicate that the various flap sections hinge about substantially parallel hinging axes. It would be possible however to have one flap section hinge about an axis which is not substantially parallel to the hinging axis of another flap section. For instance referring to FIG. 7e if the second flap section 302b were not connected on its right side in the figure but instead connected on its top side as shown in the plan view the hinging axis of the second section would, at equilibrium position, be substantially orthogonal to the hinging axis for the first flap section 302a.

In general therefore a movable cover may be supported from a side wall of a vent hole. The moveable cover may have at least one end flap portion which is hingedly coupled on one side only to an intermediate section of the moveable cover, the intermediate section itself being movable. The moveable cover may comprise one or more intermediate sections. Each intermediate section may have first and second hinged connections which may be one generally opposite side of the intermediate section. The first hinged connection may be to the side wall structure or a preceding intermediate flap section. The second hinged connection may be to the end flap section or a subsequent intermediate flap section.

As mentioned previously the vent structure may be arranged with respect to the other structure of the transducer, such as the back-plate 104, so that the vent is aligned with a gap in the back-plate to allow the vent to open to a desired extent. Thus, as described the vent may be aligned with acoustic holes in the back-plate 104. In some embodiments however the size of the acoustic holes typically provided in the back-plate may be smaller than the size of the vent. Thus in some embodiments the structure of the back-plate 104 is provided with larger holes or gaps in the vicinity of the vent structures.

The back-plate 104 is typically designed to be relatively acoustically transparent and thus providing additional holes in the vicinity of the vents is acceptable. Nevertheless changing the size and/or distribution of the holes through the back-plate may have an impact on the acoustic properties of the device, for instance the low-frequency roll-off of a microphone. The provision of holes in the back-plate to allow the vents to open may therefore be compensated by a reduction in the size and/or spacing of the acoustic holes 112 to maintained desired properties and/or the holes in the back-plate may be closely matched to the shape of the vents.

As described above the use of a variable vent having a moveable portion comprising multiple flap sections can provide a response in terms of acoustic conductance with pressure differential that is more tuned to the desired characteristics. The embodiments discussed above have focussed on tuning the response for a desired profile at high pressures such that the vent remains substantially closed for pressure differentials that are within the normal operating range of the transducer and then opens rapidly as very high pressure differentials are reached.

In some embodiments however at least some sections of the moveable cover may be designed so as to provide a degree of opening for pressure differentials that are within the normal expected operating range of the transducer, in order to tune the normal response of the transducer.

As described in the introduction there are increasing demands on transducers to be able to provide a high dynamic range, for instance to be able to operate correctly to detect relatively quiet sounds in a generally quiet environment but also not to be overwhelmed by background noise in noisy environment or wind noise or the like which can lead to relatively high pressure differentials.

MEMS microphones can experience diaphragm pull-in at relatively high sound pressure levels, where the relatively large displacement of the membrane of the membrane results in it being close to or touching the back-plate and electrostatic forces tend to pull the membrane towards and hold it against the back-plate. This can result in clipping of the acoustic signal and a low quality of the audio output from the microphone.

In some embodiments of the invention tuned vent structures therefore may be used to provide automatic passive variation of the sensitivity of the transducer. In other words the transducer has a sensitivity profile that reduces with increasing pressure differential within the expected operating range of pressure differentials, i.e., the tuned vent can be designed to provide the transducer with an automatic mechanical soft-clipping feature. The response is automatic and passive in that the response is inherent based on the pressure differential and is not under some sort of electronic control. The operation of such vents can also reduce or avoid diaphragm pull-in.

As mentioned above the variable vent structures described so far may be arranged so that at least one section of the moveable cover may be deflected to expose part of the flow path through the vent more readily than another part of the movable cover. This provides a mechanical means to provide a tuned response for increasing acoustic pressures.

Typical conversational speech may lead to a sound pressure level of around 60-70 $dB_{SPL}$ for example, or a pressure of around 0.02 Pa-0.1 Pa. A microphone may be desired to operate in noisy environments, say up to 120-130 $dB_{SPL}$, which may correspond to pressures of the order 20-60 Pa, or even greater. To provide the dynamic range for the microphone the moveable cover may be designed so as to provide a degree of opening for pressure differentials within this operating range. Thus one or more segments of the moveable cover may be significantly deflected from equilibrium position, i.e., start to open, at sound pressure levels of at least 100 $dB_{SPL}$ (or about 2 Pa) or at least 130 $dB_{SPL}$ (or about 60 Pa). In some embodiments however the cover may start to open at lower sound pressure levels, e.g. in the range of 70-100 $dB_{SPL}$ say.

For example referring back to FIG. 7c, in this embodiment the variable vent comprises a moveable portion having three different sections 302a, 302b and 302c connected by connecting regions 304a, 304b and 304c respectively which have different widths D1w, D2w and D3w and thus provide different resistance to opening, although as mentioned other dimensions of the connecting regions may additionally or alternatively be tuned to provide the desired response.

Such a vent could be arranged to provide a desired tuned response to increasing pressure differentials. For example at a first range of pressure differentials there may be no significant deflection of any of the sections of the moveable cover portion. The first range could for instance correspond to sound pressure levels at or below 80 dB or 100 dB. Thus the vent remains substantially closed and, in this example, provides substantially no flow path. The acoustic conductance of the vent will thus be very low and the vent will thus have a limited impact on sensitivity.

At higher pressure differentials, but within the expected operational range of the transducer, the third section 302c of the vent cover may start to open to provide an increased acoustic conductance, i.e., to increase the flow path through the vent hole. The third section 302c of the vent cover may be sized appropriately to provide a required acoustic conductance and, for example, the width D3w of the connecting region 304c may be configured so the third section 302c starts to open at a desired pressure.

The increased acoustic conductance will reduce the sensitivity of the transducer but, as described above the effect may be relatively small at first. The first and second sections 302a and 302b may be configured such that they are not significantly deflected from equilibrium at this point.

If the pressure differential increase further, for instance the transducer is operating in a windy environment, the second section 302b may start to deflect away from the first section when the pressure increases, say for sound pressure levels the range of 100-150 dB$_{SPL}$. This can provide a noticeably increased flow path which can help to reduce sensitivity and thus avoid overload or saturation of the signal from the transducer and/or avoid diaphragm pull-in. The first section 302a may however remain with only limited deflection from the equilibrium position. In this operating regime the sensitivity of the transducer, e.g. microphone, is thus automatically and passively adjusted in accordance with the applied pressure.

It will be appreciated that this means that the signal from the transducer may be distorted by the variable sensitivity. However as the characteristics of the variable vent structure and the acoustic conductance through the vent are known the degree of distortion can be determined. In some embodiments therefore a known compensation can be applied to the signal received from the transducer in post processing to correct for this known distortion characteristic.

The variable vent structure may also be arranged to provide venting in response to high pressure events to protect the membrane from damage. For instance the first section 302a may be configured such that it is only significantly deflected from its equilibrium position at higher pressure differentials, which may be above or towards the upper end of the expected normal operating range. In the event of a very high pressure differential the first section 302a thus deflects to open the variable vent even further to allow for rapid pressure equalisation. In some embodiments however different vent structures may be provided for tuning the acoustic performance in the normal operating range and for providing pressure relief in high pressure situations.

Thus for a vent with a moveable cover portion having a plurality of flap sections which are hingedly coupled to one another (with one flap section being hingedly coupled to the side wall of the vent hole, e.g. the rest of the membrane), at least one flap section may be configured to be significantly deflected at pressure differentials in the normal operating range of the device to provide a high dynamic range for the transducer. In some embodiments in addition to such a flap section arranged to provide a high dynamic range there may be at least one flap section arranged so as to provide additional venting, i.e., an increase in flow path through the vent, at higher pressure differentials so to reduce or prevent damage to the transducer in very high pressure situations.

In some embodiments there may be multiple variable vent structures and at least some vent structures may be designed to have a different response from one another. In other words a first vent structure may provide a moveable cover with sections that are tuned to provide a first profile of acoustic conductance with pressure differential and a second vent structure may be tuned to provide a different profile.

The use of multiple different variable vents where at least some vents operate at different differential pressures to one another may be used to provide the benefits of a tuned response even with vent structures that have a movable cover which consists of a single moveable flap portion.

Figure 8:
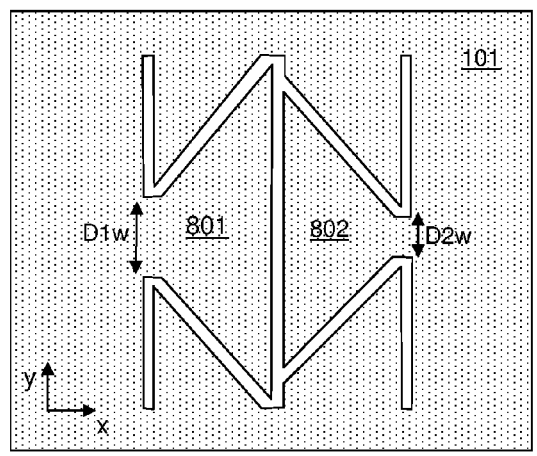
FIG. 8 illustrates two separate vents tuned to have different operating profiles.

For instance FIG. 8 illustrates two variable vent structures which are arranged to have a different response from one another. Thus a first vent structure comprises a movable flap portion 801 which is of a first size and which is connected to the rest of the membrane by a connecting region having a first width D1w (which in FIG. 8 is the y-axis dimension).

Unlike the embodiments described above the moveable cover portion of this vent comprises just a single section. However a second vent structure comprises a moveable flap portion 802 which is separate to movable flap portion 801 and which has a different size thereto. The flap portion 802 of the second vent structure in this example is connected by a connecting region of a different width, D2w. The two vent structures are shown in this embodiment as being side by side and arranged in the same vent hole but it will be appreciated that the vents structures could be located in separate parts of the membrane, each having its own vent hole. The flap portion 802 may therefore deflect away from the membrane more readily than the flap portion 801 to provide a flow path. The size of the flap portions and connecting regions can be tailored to provide a desired tuned acoustic response in a similar fashion as described above.

It will be understood that the effective strength of the hinge portion of such a vent can be altered by changing the amount of material forming the connecting region, and possible the number of connections points forming the connection or the use of torsion beams or the like. In some embodiments the properties of the hinge connection may be determined by depositing additional material in the connecting region.

The collective pressure differential response of all of the variable vent structures in the membrane can therefore be designed to provide an overall desired response for the transducer. As mentioned if this collective response is known, e.g. predetermined or determined in some sort of factory calibration step, then it may be possible to remove any distortion in the output signal of the transducer by removing the known response in post processing of the signal. The vents may take any of the forms described above and/or in WO2014/045040.

As mentioned above the variable vents according to any of the above described embodiments may be formed in the flexible membrane to provide a flow path through the membrane. To ensure that the vents can open correctly and/or to provide an adequate flow path when open, the vents may be positioned so as to, at least partly, overlie the cavity in the substrate as illustrated in FIG. 9.

As described above the cavity 109 between the membrane layer 101 and the substrate may be defined accurately by using appropriately patterned sacrificial material. The substrate cavity 108 is etched to join up with this cavity 109 but, to avoid the less accurate back etch that forms the substrate cavity from defining the membrane the edges of the opening of the substrate cavity are within the area of the cavity 109. FIG. 9 illustrates the edge 901 of the opening of the substrate cavity 108.

Conveniently the variable vents 301 are arranged so as to at least partly overlie the opening of the substrate cavity 108, in other words the vent is arranged so the flow path through the vent, when open, provide a path between the substrate cavity and the cavity on the other side of the membrane which is reasonable direct. FIG. 9 thus illustrates that for a variable vent structure with multiple hinged flap portions at least the end flap overlies the opening of the substrate cavity, i.e., extends inwards beyond the shelf or dog-leg formed by the substrate layers. This also allows them to open without colliding with any part of the substrate. In this embodiment, there is also a hole 902 in the back plate 104 which is positioned in the location where the variable vent 301 will open. The hole 902 may be one of the usual acoustic holes in the back-plate but in some embodiments may be a larger than typical hole. The hole 902 again allows a direct flow path between the front and back volumes in use when the vent is open and may provide a space for the variable vent to open into without unwanted contact with the back-plate.

Figure 9:
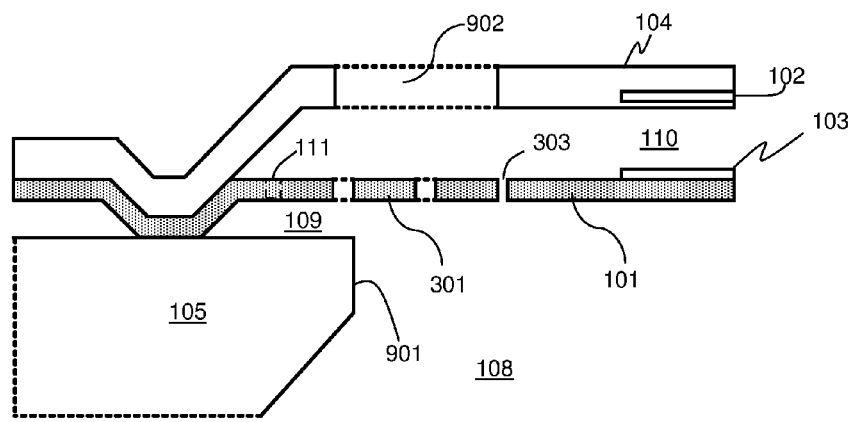
FIG. 9 illustrates how vents according to embodiments of the invention may be located in the flexible membrane of a transducer.

FIG. 9 also illustrates that at least some of the bleed holes may be positioned in the region of the membrane that overlies the shelf or dog-leg of the substrate layers 105, e.g. outside the area of opening of the substrate cavity. This means that the bleed holes do not provide a direct flow path between the front and back volumes and instead the flow path is tortuous. This reduces the impact of the bleed holes at acoustic frequencies whilst still allow for the low frequency response.

Figure 10:
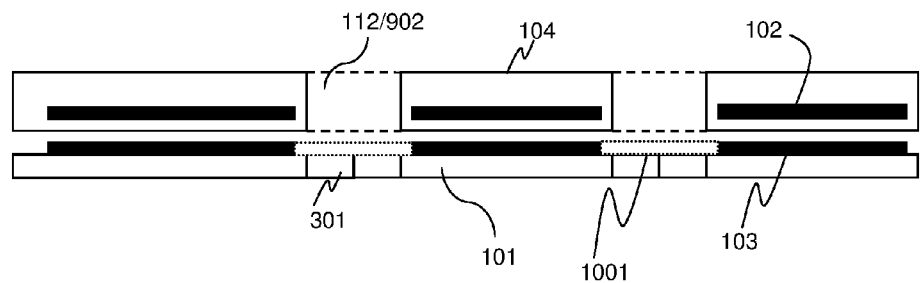
FIG. 10 illustrates another example how vents according to embodiments of the invention may be located in the flexible membrane of a transducer.

As mentioned above one or more variable vents may be located in the membrane layer 101 outside the area of the membrane electrode 103. In some embodiments however the membrane electrode may itself have a plurality of openings, i.e., holes or apertures, in the membrane, which may for instance correspond to the location of the acoustic holes 112 in the back plate, as illustrated in FIG. 10 which illustrates a side view of part of the membrane and back plate (omitting the side wall supports for clarity). FIG. 10 illustrates the membrane layer 101 which has a membrane electrode layer 103. In this embodiment the membrane electrode has at least one opening 1001, or area devoid of membrane electrode material, within the perimeter of the electrode. The opening(s) or aperture(s) may for instance comprise holes through the membrane electrode layer any may correspond to the location of the acoustic holes 112 (at equilibrium position).

For MEMS sensors having a metal membrane electrode 103 provided on a flexible membrane layer 101, especially a membrane layer which is a crystalline material, it has been appreciated that plastic deformation of the metal in use may mean that the quiescent position of the membrane and/or stress characteristics can change overtime with use. This can result in an unwanted DC offset and/or a change in sensitivity of the sensor and the subsequent quality of the acoustic signal being reproduced may be significantly degraded. Typically the membrane electrode is relatively thin, for example of the order of about 60 nm or so, and using a thinner membrane electrode layer may not be possible or practical for conventional MEMS processes. Using a smaller diameter electrode on the membrane would reduce the amount of metal to undergo plastic deformation but would also result in a loss of sensitivity—as capacitance is linked to electrode area. This is undesirable, especially as the capacitance of a MEMS sensor is relatively low anyway.

Figure 1A:
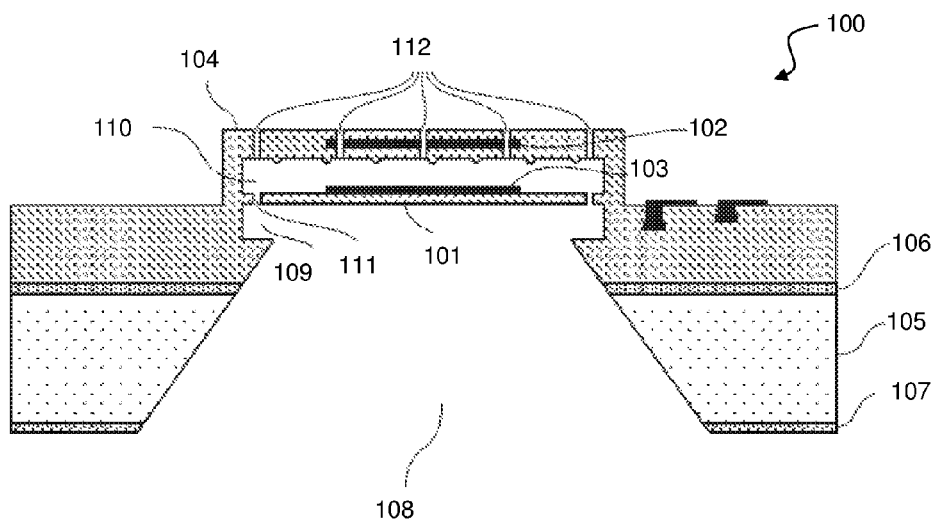
FIGS. 1a and 1b illustrate sectional and perspective views of a known MEMS microphone structure.
Figure 1B:
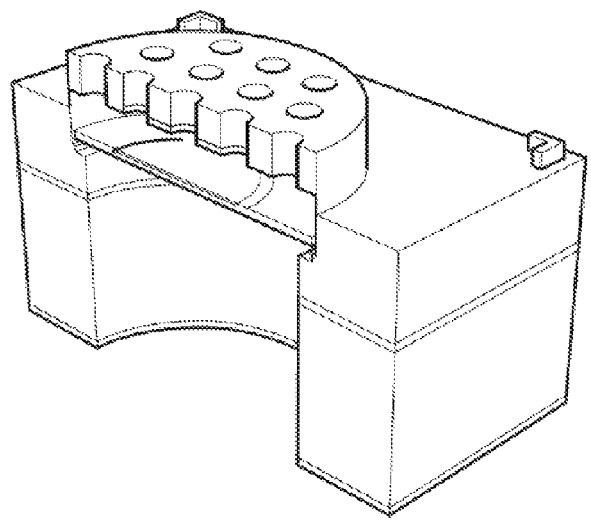

In the embodiment illustrated in FIG. 10 there are areas of opening 1001 within the perimeter of the membrane, i.e., areas devoid of any metal of the membrane electrode 103. This reduces the total amount of metal for an electrode of a given perimeter size compared with a continuous electrode over the whole area within the perimeter, such as illustrated with respect to FIG. 1a, and thus mitigates the problems mentioned above. In the embodiment illustrated in FIG. 10 the openings in membrane electrode correspond to the acoustic holes in the back plate 104, and thus are located in areas where there is a corresponding opening in back plate electrode 102. Thus the area of overlap between the back plate electrode 102 and membrane electrode 103 is not substantially reduced by having openings in the membrane electrode in areas where there would, in any case, be openings in the back-plate electrode. Thus the capacitance and hence sensitivity of a transducer such as illustrated with respect to FIG. 10 is not significantly reduced compared to a transducer with a membrane electrode of similar perimeter size but a wholly continuous membrane electrode such as illustrated in FIG. 1a, but the problems with plastic deformation of the electrode leading to dc offset are mitigated.

In such an embodiment at least one variable vent 301 may therefore be located in the membrane layer 101 to correspond to an area of opening 1001 in the membrane electrode 103. As mentioned these areas of openings may be located to correspond to the acoustic holes in the back plate. The acoustic holes that correspond to the vents 301 may be conventional acoustic holes 112 or holes 902 sized to allow sufficient opening of the vents.

Embodiments of the invention thus relate to vent structures for MEMS transducers, especially MEMS capacitive microphones. Some embodiments relate to a variable vent having a movable cover portion which is connected to the side of a vent hole so as to be movable with respect to the hole, the cover portion comprising at least two flap sections where the flap sections are connected so as to be hinged with respect to one another. The vent hole may be through the membrane of the transducer and thus the vent cover may be coupled to the rest of the membrane and may comprise the same material as the membrane. The moveable cover may thus comprise a plurality of hinge connections, with one hinge connection being to the side wall of the vent hole, e.g. the membrane.

Although the various embodiments above have been described with respect to a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

The MEMS transducer may be formed on a transducer die and may in some instances be integrated with at least some electronics for operation of the transducer.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

One or more transducers according to the any of the embodiments described above may be incorporated in a package. FIGS. 11a to 11f illustrate various different packaging arrangements. FIGS. 11a to 11f each show one transducer element located in the package but it will be appreciated that in some embodiments there may be more one than transducer, e.g. a transducer array, and the various transducers may be formed on the same transducer substrate, i.e., a monolithic transducer substrate, or may be formed as separate transducers with separate transducer substrates each separate transducer substrate being bonded to a package substrate.

Figures 11A, 11B:
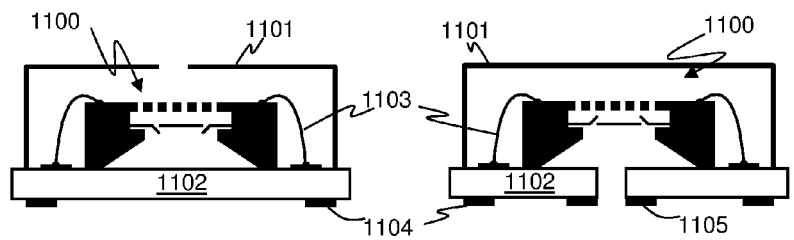
FIGS. 11a-11f illustrate various MEMS transducer packages.

FIG. 11a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e., solder pads, 1104 for electrically connecting external circuitry (not illustrated) to the package to allow transmission of electrical signals to/from the transducer 1100. In the example shown in FIG. 11a there is a sound port or acoustic port in the cover 1101 to allow sound to enter the package and the transducer is arranged in a top port arrangement.

FIG. 11b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement with the volume defined by the housing 1101 forming part of the back-volume of the transducer.

Figures 11C, 11D:
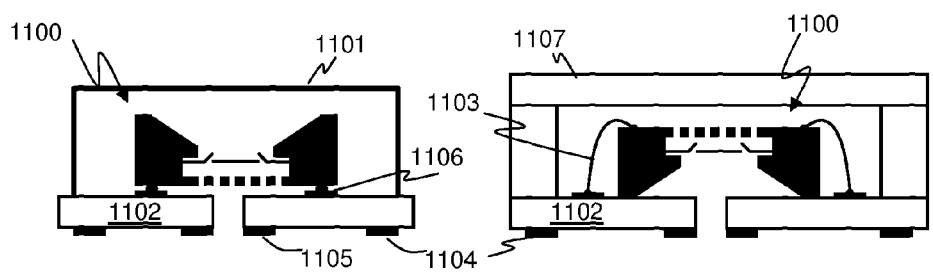
Figures 11E, 11F:
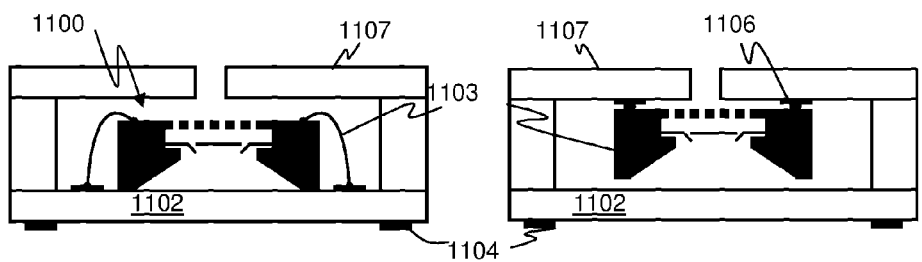

FIG. 11e illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

FIG. 11d illustrates an alternative example to that of FIG. 11b wherein a housing 1107 is formed from various panels of material, for example PCB or the like. In this instance the housing 1107 may comprise one or more conductive layers and/or one or more insulating layers. FIG. 11d shows the sound port in the package substrate. FIG. 11e shows an alternative arrangement to that of FIG. 11b wherein a housing 1107 is formed from various panels of material, for example PCB or the like as described in relation to FIG. 11d. FIG. 11f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
a membrane layer; and
at least one variable vent structure comprising:
a vent hole for venting fluid so as to reduce a pressure differential across the membrane layer; and
a moveable vent cover which, at an equilibrium position, at least partly blocks said vent hole;
wherein the vent cover is moveable from said equilibrium position in response to a pressure differential across the vent cover so as to vary the size of a flow path through the vent hole; and
wherein the vent cover comprises at least a first flap section and a second flap section, the first flap section being hingedly coupled to the side of the vent hole and the second flap section being hingedly coupled to the first flap section so as to be moveable with respect to the first flap section.

2. A MEMS transducer as claimed in claim 1 wherein the second flap section is coupled to the side of the vent hole only via the first flap section.

3. A MEMS transducer as claimed in claim 1 wherein the second flap section is articulated to the first flap section.

4. A MEMS transducer as claimed in claim 1 wherein the vent cover is configured such that the extent to which the first flap section deflects away from equilibrium position for a given pressure differential is different to the extent to which the second flap section deflects away from the first flap section for the same pressure differential.

5. A MEMS transducer as claimed in claim 4 wherein the vent cover is configured such that the second flap section deflects away from the first flap section more readily than the first flap section deflects away from equilibrium position.

6. A MEMS transducer as claimed in claim 4 wherein the vent cover is configured such that, in use, for at least one pressure differential the amount of deflection of the second flap section with respect to the first flap section will be greater than the amount of deflection of the first flap section from equilibrium.

7. A MEMS transducer as claimed in claim 1 wherein the first flap section is coupled to the side of the vent hole via a first connection and the second flap section is coupled to the first flap section by a second connection.

8. A MEMS transducer as claimed in claim 7 wherein the dimensions and/or geometry of the first connection and second connection are different from one another.

9. A MEMS transducer as claimed in claim 7 wherein at least one of the first and second connections comprises a beam structure.

10. A MEMS transducer as claimed in claim 7 wherein at least one of the first and second connections comprises a plurality of connecting regions spaced apart along a hinging axis.

11. A MEMS transducer as claimed in claim 1 wherein the first flap section is coupled to the side of the vent hole for movement substantially about a first hinging axis and the second flap section is coupled to the first flap section for movement with respect to the first flap section substantially about a second hinging axis, wherein the first and second hinging axes are parallel to one another.

12. A MEMS transducer as claimed in claim 11 wherein the first flap section is coupled for movement about the first hinging axis in a rotational direction and the second flap section is coupled for movement about the second hinging axis in the same rotational direction.

13. A MEMS transducer as claimed in claim 11 wherein the first flap section is coupled for movement about the first hinging axis in a rotational direction and the second flap section is coupled for movement about the second hinging axis in the opposite rotational direction.

14. A MEMS transducer as claimed in claim 1 wherein the second flap section is within the perimeter of the first flap section.

15. A MEMS transducer as claimed in claim 1 wherein the vent cover is configured such that, in use, at least the first flap section is not substantially deflected from equilibrium position at pressure differentials below a first pressure threshold and is substantially deflected from equilibrium position at pressure differentials above a second pressure threshold for the first flap section.

16. A MEMS transducer as claimed in claim 15 wherein the vent cover is configured such that, in use, the second flap section is substantially deflected from equilibrium position at pressure differentials above a second pressure threshold for the second flap section.

17. A MEMS transducer as claimed in claim 1 wherein the vent cover comprises at least one additional flap section, wherein each additional flap section is hingedly coupled to one of the first flap section or the second flap section or an intermediate additional flap section.

18. A MEMS transducer as claimed in claim 1 wherein the vent cover is configured to provide a flow path size that varies, in use, with pressure within the normal expected operating range of the MEMS transducer so as to provide a variable sensitivity.

19. A MEMS transducer as claimed claim 1 wherein the vent hole is formed in a first layer of material and the vent cover is formed from the same material as said first layer wherein the vent cover is configured such that, at equilibrium position said first flap section and said second flap section lie substantially with the plane of the first layer.

20. A MEMS transducer as claimed in claim 19 wherein the first layer is the membrane layer.

21. An electronic device comprising a MEMS transducer as claimed in claim 1 wherein said device is at least one of: a portable device; a battery powered device; an audio device; a computing device; a communications device; a personal media player; a mobile telephone; a games device; a wearable device; and a voice controlled device.

22. A MEMS transducer comprising:
a flexible membrane; and
at least one variable vent structure wherein said variable vent structure provides a flow path having a size that varies with pressure differential across the membrane;
wherein said variable vent structure comprises at least one moveable portion which is moveable in response to a pressure differential across the moveable portion so as to vary the size of a flow path through the vent structure; and
wherein said moveable portion comprises:
a first flap section;
a first hinge connection coupling the first flap section to a side of the variable vent structure such that the first flap section may be deflected away from an equilibrium position;
a second flap section; and
a second hinge connection coupling the second flap section to the first flap section such that the second flap section may be deflected away from the first flap section.

23. A MEMS transducer comprising:
a flexible membrane; and
at least one variable vent structure comprising a vent hole for venting fluid so as to reduce a pressure differential across the flexible membrane and a moveable vent cover which, at an equilibrium position, at least partly blocks said vent hole;
wherein the vent cover is moveable from said equilibrium position in response to a pressure differential across the vent cover so as to vary the size of a flow path through the vent hole;
wherein the vent cover comprises a first flap section coupled to a side of the vent hole and at least one second flap section coupled to the first flap portion,
the vent cover being configured such that the first flap section it is moveable from the equilibrium position and the second flap section is moveable with respect to the first flap section such that, for at least a first range of pressure differentials across the vent cover, the second flap section is deflected from its equilibrium position by a greater angle than the first flap section.

24. A MEMS transducer comprising:
a flexible membrane; and
at least one variable vent structure comprising a vent hole for venting fluid so as to reduce a pressure differential across the flexible membrane and a moveable vent cover which, at an equilibrium position, at least partly blocks said vent hole;
wherein the vent cover is moveable from said equilibrium position in response to a pressure differential across the vent cover so as to vary the size of a flow path through the vent hole;
wherein the vent cover comprises a first flap section coupled to a side of the vent hole so as to be moveable from the equilibrium position and at least one second flap section coupled to the first flap section so as to be moveable with respect to the first flap section,
wherein the resistance to movement of the second flap portion with respect to the first flap section is lower than the resistance to movement of the first flap section from equilibrium position.

* * * * *